(12) United States Patent
Kajigaya

(10) Patent No.: US 10,839,933 B2
(45) Date of Patent: *Nov. 17, 2020

(54) MEMORY DEVICES HAVING A READ FUNCTION OF DATA STORED IN A PLURALITY OF REFERENCE CELLS

(71) Applicant: MICRON TECHNOLOGY, INC., Boise, ID (US)

(72) Inventor: Kazuhiko Kajigaya, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/445,149

(22) Filed: Jun. 18, 2019

(65) Prior Publication Data

US 2019/0304564 A1 Oct. 3, 2019

Related U.S. Application Data

(63) Continuation of application No. 14/701,366, filed on Apr. 30, 2015, now Pat. No. 10,381,102.

(30) Foreign Application Priority Data

Apr. 30, 2014 (JP) .................................. 2014-093468
May 19, 2014 (JP) .................................. 2014-103462

(51) Int. Cl.
*G11C 29/52* (2006.01)
*G11C 11/16* (2006.01)
(Continued)

(52) U.S. Cl.
CPC .............. *G11C 29/52* (2013.01); *G06F 11/08* (2013.01); *G06F 11/1048* (2013.01);
(Continued)

(58) Field of Classification Search
CPC ...... G11C 29/52; G11C 11/1673; G11C 11/16; G11C 13/00; G11C 29/04;
(Continued)

(56) References Cited

U.S. PATENT DOCUMENTS 4,730,320 A 3/1988 Hidaka et al.
6,307,783 B1 10/2001 Parker
(Continued)

FOREIGN PATENT DOCUMENTS

JP 05-136361 6/1993
JP 2002-222589 8/2002

OTHER PUBLICATIONS

U.S. Appl. No. 15/857,838, entitled 'Semiconductor Device and Error Correction Method', filed Dec. 29, 2017, pp. all.

*Primary Examiner* — Kyle Vallecillo
(74) *Attorney, Agent, or Firm* — Dorsey & Whitney LLP

(57) ABSTRACT

A semiconductor device is provided with normal memory cells constituted so as to store user data, reference memory cells constituted so as to generate a reference signal for reading out the normal memory cells, and a control circuit that carries out a defect detecting operation for detecting whether or not the reference memory cell and data stored in the reference memory cell are coincident with expected values on the stored data read out from the reference memory cells. Moreover, it is also provided with a control circuit for executing a defect correcting operation for correcting data to be stored in the reference memory cells that are detected as defective. Furthermore, it is also provided with a control circuit that is configured so as to cut off the reference memory cell detected as defective from the sense amplifier.

19 Claims, 28 Drawing Sheets

(51) Int. Cl.
*G06F 11/10* (2006.01)
*G06F 11/08* (2006.01)
*G06F 11/16* (2006.01)
*G06F 11/20* (2006.01)
*G11C 29/04* (2006.01)
*G11C 13/00* (2006.01)

(52) U.S. Cl.
CPC ...... *G06F 11/1068* (2013.01); *G11C 11/1673* (2013.01); *G06F 11/16* (2013.01); *G06F 11/167* (2013.01); *G06F 11/1608* (2013.01); *G06F 11/1612* (2013.01); *G06F 11/1658* (2013.01); *G06F 11/1662* (2013.01); *G06F 11/1666* (2013.01); *G06F 11/20* (2013.01); *G11C 11/16* (2013.01); *G11C 13/00* (2013.01); *G11C 29/04* (2013.01); *G11C 2029/0409* (2013.01); *G11C 2029/0411* (2013.01)

(58) Field of Classification Search
CPC ..... G11C 2029/0409; G11C 2029/0411; G06F 11/08; G06F 11/1048; G06F 11/1068; G06F 11/16; G06F 11/1608; G06F 11/1612; G06F 11/1658; G06F 11/1662; G06F 11/1666; G06F 11/167; G06F 11/20
See application file for complete search history.

(56) References Cited

U.S. PATENT DOCUMENTS

| | | | |
|---|---|---|---|
| 6,332,206 B1 | 12/2001 | Nakatsuji et al. | |
| 6,351,412 B1 | 2/2002 | Nozoe et al. | |
| 6,430,723 B2 | 8/2002 | Kodama et al. | |
| 6,453,441 B1 | 9/2002 | Daoudi et al. | |
| 7,196,933 B2 | 3/2007 | Shibata | |
| 7,433,246 B2 | 10/2008 | Lee | |
| 7,525,839 B2 | 4/2009 | Shibata et al. | |
| 7,574,648 B2 | 8/2009 | Akiyama et al. | |
| 7,688,617 B2 | 3/2010 | Sakimura et al. | |
| 7,768,830 B2 | 8/2010 | Shibata et al. | |
| 7,793,197 B2 | 9/2010 | Ito et al. | |
| 7,872,911 B2 | 1/2011 | Sarin et al. | |
| 7,936,586 B2 | 5/2011 | Liu et al. | |
| 7,975,209 B2 | 7/2011 | Chin et al. | |
| 8,000,134 B2 | 8/2011 | Cornwell et al. | |
| 8,281,221 B2 | 10/2012 | Sakimura et al. | |
| 8,312,348 B2 | 11/2012 | Yamaga | |
| 8,355,291 B2 | 1/2013 | Kim et al. | |
| 8,503,218 B2 | 8/2013 | Kim et al. | |
| 8,510,633 B2 | 8/2013 | Sakimura et al. | |
| 8,743,632 B2 | 6/2014 | Kim et al. | |
| 9,093,145 B2 | 7/2015 | Oh et al. | |
| 9,558,063 B2 | 1/2017 | Kajigaya et al. | |
| 10,381,102 B2 | 8/2019 | Kajigaya | |
| 2001/0052093 A1 | 12/2001 | Mick | |
| 2004/0032759 A1* | 2/2004 | Chow | G11C 11/22 365/145 |
| 2004/0165419 A1 | 8/2004 | Tsuji | |
| 2007/0198904 A1 | 8/2007 | Yoshida | |
| 2007/0297223 A1 | 12/2007 | Chen et al. | |
| 2008/0056041 A1* | 3/2008 | Liaw | G11C 7/18 365/208 |
| 2009/0141544 A1 | 6/2009 | Sakimura et al. | |
| 2010/0046274 A1 | 2/2010 | Tsuchida et al. | |
| 2011/0016371 A1 | 1/2011 | Sakimura et al. | |
| 2011/0069554 A1* | 3/2011 | Lo Giudice | G11C 16/28 365/185.21 |
| 2011/0173513 A1 | 7/2011 | DeBrosse et al. | |
| 2011/0289386 A1 | 11/2011 | Yang | |
| 2012/0314484 A1* | 12/2012 | Koya | G11C 11/565 365/149 |
| 2013/0051114 A1 | 2/2013 | Kim et al. | |
| 2013/0314979 A1 | 11/2013 | Lee | |
| 2014/0071739 A1 | 3/2014 | Kim et al. | |
| 2015/0074493 A1 | 3/2015 | Kajigaya | |
| 2015/0146481 A1 | 5/2015 | Lin | |
| 2015/0318033 A1 | 11/2015 | Kajigaya | |
| 2017/0117044 A1 | 4/2017 | Kajigaya | |
| 2018/0122477 A1 | 5/2018 | Kajigaya | |
| 2019/0304564 A1 | 10/2019 | Kajigaya | |

* cited by examiner ated patent, and disclosures
MEMORY DEVICES HAVING A READ FUNCTION OF DATA STORED IN A PLURALITY OF REFERENCE CELLS

PRIORITY

This application is a continuation of U.S. patent application Ser. No. 14/701,366 filed Apr. 20, 2015 and issued as U.S. Pat. No. 10,381,102 on Aug. 13, 2019, which application is based upon and claims the benefit of priority from Japanese Patent Applications No. 2014-093468 filed on Apr. 30, 2014 and No. 2014-103462 filed on May 19, 2014. The aforementioned application, issued patent, and disclosures are incorporated herein by reference, in their entirety, for any purpose.

BACKGROUND

1. Field of the Invention

The present invention relates to a semiconductor memory device and a stored data readout method. In particular, the present invention relates to a semiconductor memory device in which a reference memory cell for generating a reference electric potential of a reference electric current for use in reading out stored data is installed, and a readout method for the stored data.

2. Description of Related Art

As a variable resistance-type nonvolatile memory cell, a STT-RAM (Spin Transfer Torque-Random Access Memory), a PCRAM (Phase Change Random Access Memory), a ReRAM (Resistance Random Access Memory) or the like has been known. In the variable resistance-type nonvolatile memory cell, upon reading out data to be stored in the memory cell, a reference signal (such as reference voltage, or reference current) is used.

As one example of the means for generating this reference signal, a memory cell for use as the reference (hereinafter, referred to as a reference memory cell) has been used. In general, the reference memory cell has the same configuration as that of a normal memory cell, and is disposed in a memory cell array in many cases.

It has been known that the reference memory cell is configured by two memory cells so as to use an intermediate value consequently generated by the cells (intermediate voltage or intermediate current) as the reference signal. In this example, each of reference memory cells for storing data "0" and each of reference memory cells for storing data "1" are used one by one.

A sense amplifier compares a readout signal from the memory cell with the reference signal and discriminates data based upon the sizes thereof.

DETAILED DESCRIPTION

Figure 1:
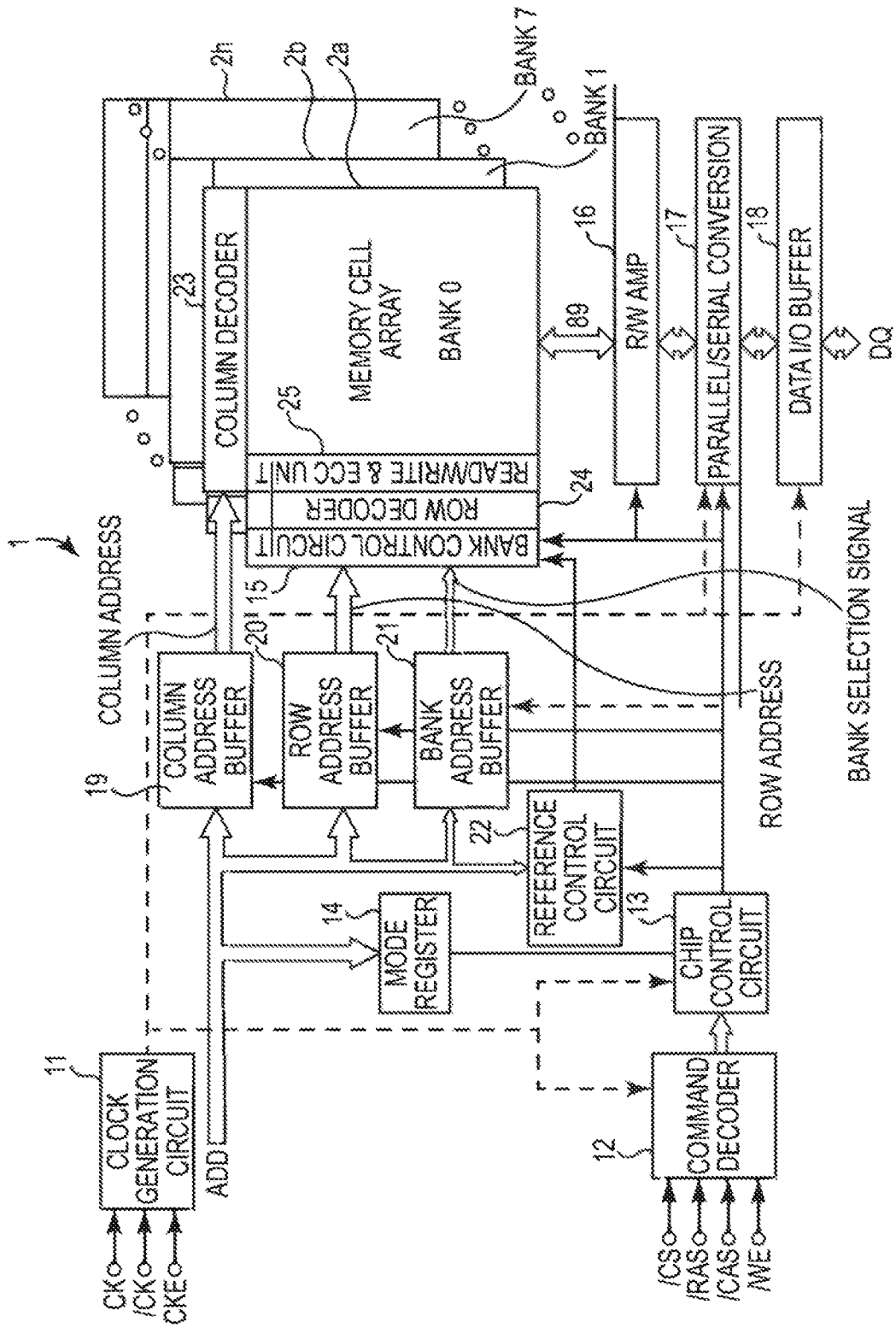
FIG. 1 is a block diagram showing the entire configuration of a semiconductor device in accordance with a first embodiment.

The following description will discuss the outline of one embodiment. Additionally, reference numerals for drawings attached to the outline are denoted to the respective elements on demand as examples for use in aiding understanding thereof, and the description of the outline is not intended to limit the present invention.

In the present specification, memory cells for use in storing user data to be supplied from the outside are denoted as "normal cells". Moreover, data for use in generating a reference signal are denoted as "reference data", and memory cells for storing the reference data are denoted as "reference memory cells". Furthermore, data for use in detecting and correcting an error of the readout data are denoted as "check data", and memory cells for storing the check data are denoted as "check cells".

FIG. 1 is a block diagram showing the entire configuration of a semiconductor device 1 in accordance with a first embodiment.

The semiconductor device 1 shown in FIG. 1 is provided with a memory cell array including a plurality of memory cells. The memory cells are not particularly limited; however, the present embodiment will be discussed on the premise that a memory cell for soring data based upon a change in resistance value, such as a STT-RAM, a PCRAM, a ReRAM or the like, is utilized.

The memory cell array of the semiconductor device 1 is composed of a plurality of memory cell arrays 2a to 2h, each of which is constituted by a plurality of banks (for example, an 8-bank configuration with banks 0 to 7). Additionally, in the following description, if there is no particular reason for distinguishing the respective memory cell arrays 2a to 2h, they are denoted simply as "memory cell arrays 2". Moreover, the other structural elements are also denoted in the same manner, and each of the corresponding structural elements is supposed to be typically represented by a symbol denoted before an alphabet or a hyphen "-".

As external terminals, the semiconductor device 1 is provided with external clock terminals CK and /CK, a clock enable terminal CKE, command terminals /CS, /RAS, /CAS and /WE and data input/output terminals DQ with 8 bits as external terminals. Additionally, in the present specification, each of signals having "/" attached to its leading portion of the signal name means that it is an inversion signal or a low active signal of the corresponding signal. Therefore, for example, signals represented by CK and /CK correspond to mutually complementary signals.

A clock generation circuit 11 has external clock signal CK and /CK, as well as a clock enable signal CKE, inputted thereto. The clock generation circuit 11 generates inner clock signals required in the semiconductor device 1, and delivers them to the respective units.

The command terminals /CS, /RAS, /CAS and /WE receive a chip select signal /CS, a low address strobe signal /RAS, a column address strobe signal /CAS and a write enable signal /WE respectively. These command signals are supplied to a command decoder 12. The command decoder 12 decodes the inputted command signals, and supplies the resulting signals to a chip control circuit 13.

Operation modes of the semiconductor device 1 are set in a mode register 14. The chip control circuit 13 inputs an output of the command decoder 12 and an operation mode set in the mode register 14, and generates various control signals based upon these.

The chip control circuit 13 supplies various control signals thus generated to a bank control circuit 15, a read/write amplifier (RW amplifier) 16, a parallel/serial conversion circuit 17, a column address buffer 19, a row address buffer 20, a bank address buffer 21 and a reference control circuit 22.

Address signals ADD include a bank address for specifying a bank, a row address for specifying a word line and a column address for specifying a bitline. The row address and column address are inputted from the address terminal in an address multiplexer format. However, the input format of the address signal is not intended to be limited by this.

Of the address signals ADD, the column address is supplied to the column address buffer 19, the row address is supplied to the row address buffer 20 and the bank address is supplied to the bank address buffer 21 respectively.

The column address outputted by the column address buffer 19 is decoded by a column decoder 23, and based upon the decoded signal, a bitline corresponding to the column address of the plural bitlines is selected.

The row address outputted by the row address buffer 20 is decoded by a row decoder 24, and based upon the decoded signal, any one of the word lines is selected. Moreover, the row address also includes address information for allowing a selector control circuit 53 which will be described later to select one of normal bitlines from n number of bitlines.

The bank address buffer 21 outputs a bank selection signal for specifying any one of the banks 0 to 7. The bank control circuit 15 switches the banks 0 to 7 in accordance with the bank selection signal.

The read/write amplifier 16 includes a read amplifier circuit and a write amplifier circuit connected to the data input/output terminal DQ serving as the external terminal through the parallel/serial conversion circuit 17 and the data input/output buffer 18. To the parallel/serial conversion circuit 17 and the data input/output buffer 18, an inner clock signal is supplied from the clock generation circuit 11 so that the timing of the input/output of data between the memory cell array and the data input/output terminal DQ is controlled.

The reference control circuit 22 is a circuit for controlling a selection as to whether a normal cell for storing user data is used as an access target or a reference memory cell for storing reference data is used as the access target of the memory cells contained in the memory cell array 2. The detailed description of the reference control circuit 22 will be given later.

The sense amplifier for use in reading out data from the memory cells, the write driver for use in writing data in the memory cells and the like are included in the read/write & ECC unit 25. The detailed description of the read/write & ECC unit 25 will be given later.

Scrubbing of Reference Memory Cells

The chip control circuit 13 carries out a scrubbing process on the reference memory cells by outputting a control signal to the reference control circuit 22. Additionally, it is the premise that prior to executing the scrubbing process, a correction code (check data, or ECC) is generated based upon the writing data to the reference memory cells.

The scrubbing process for the reference memory cells is constituted by the following processes.

(1) A reference memory cell is selected as an accessing target, and reference data stored in the reference memory cell are read out.

(2) An error detecting process is carried out on the reference data thus read out, and in the case when an error is detected, the error is corrected by using the ECC.

(3) The data (inversion value of the stored data) corrected by using the ECC are written in the reference memory cell in which the reference data with the error detected therein are stored.

The scrubbing process for the reference memory cell is carried out by using a command generated by a memory controller connected to the semiconductor device 1 as a trigger. Alternatively, in cooperation with the execution of a scrubbing process for a normal cell, for example, such as an auto-scrubbing process and a self-scrubbing process corresponding to a refresh operation of a DRAM (Dynamic Random Access Memory), the scrubbing process for the reference memory cell may be carried out.

Figure 2:
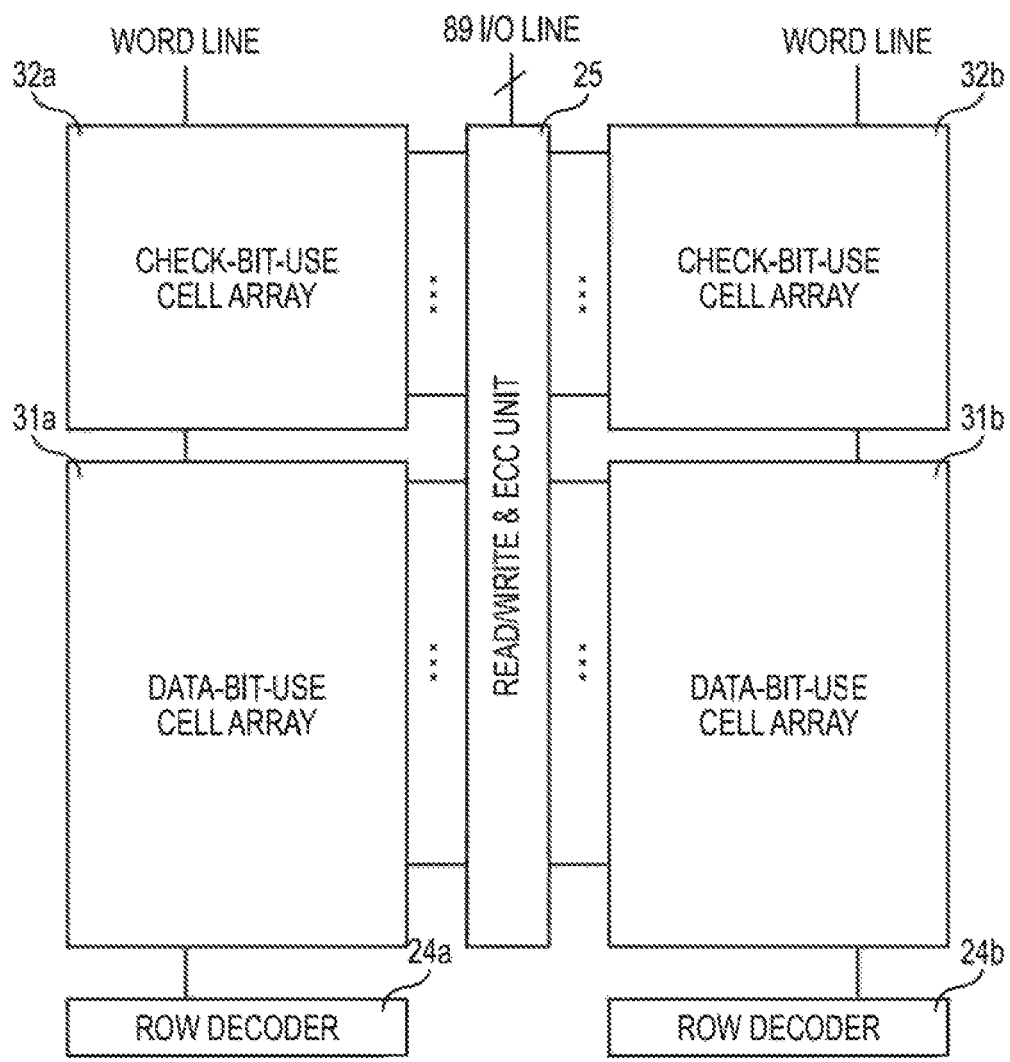
FIG. 2 is a schematic view showing one example of a configuration of a memory cell array.

FIG. 2 is a schematic view showing one example of a configuration of the memory cell array 2.

The memory cell array 2 is provided with data-bit-use cell arrays 31a and 31b including a plurality of normal cells for storing user data.

The memory cell array 2 is provided with check-bit-use cell arrays 32a and 32b including a plurality of check cells for storing correction codes (check data) for use in correcting writing data, which are generated when writing data are supplied from the outside.

Although its detailed description will be given later, the data-bit-use cell arrays 31a and 31b include normal cells and reference memory cells. Check-bit-use cell arrays 32a and 32b also include check cells and reference memory cells.

The read/write & ECC unit 25, which is disposed in the center of the memory cell array 2, includes a read/write circuit for use in accessing to the memory cells and an ECC circuit for carrying out an error correction on data read out from the memory cells.

The read/write circuit includes a sense amplifier connected thereto with the memory cell and bitline interposed therebetween, and data read out by the sense amplifier are sent to the outside through an I/O line 89. Alternatively, writing data externally inputted through the I/O line 89 are written in the respective memory cells by writing drivers included in the read/write circuit.

The data-bit-use cell arrays 31a and 31b and the check-bit-use cell arrays 32a and 32b are disposed laterally symmetrically with each other centered on the read/write & ECC unit 25.

Each of the sense amplifiers included in the read/write & ECC unit 25 is connected to the corresponding memory cell contained in the respective cell arrays disposed in right and left directions through a bitline selected by the column decoder 23.

For an accessing process to the memory cell, a word line selected by the row decoder 24 is used. Since the row decoder 24 needs to select a word lite for extending the cell arrays on the left side and a word line for extending the cell arrays on the right side. FIG. 2 denotes a row decoder 24a for the left side and a row decoder 24b for the right side.

Figure 3:
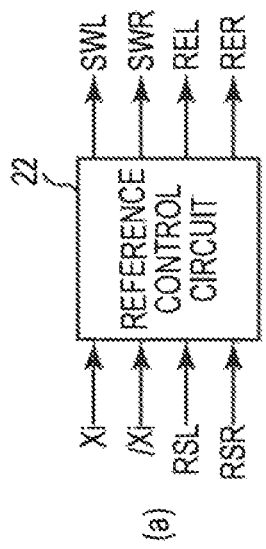
FIG. 3 is a view for use in explaining an input/output of a reference control circuit.

FIG. 3 is a view for use in explaining an input/output of the reference control circuit 22.

With reference to FIG. 3(a), to the reference control circuit 22, a row address Xi (i represents a positive integer; the same is true in the following description, an inversion signal /Xi to the row address Xi and reference memory cell selection signals RSL and RSR are inputted.

The row address Xi corresponds to the most significant bit of the row address supplied from the row address buffer 20, which is a row address for use in selecting either one of the memory cell arrays disposed on the right and left sides of the read/write & ECC unit 25 including the sense amplifiers.

FIG. 3(b) shows a relationship between input/output signals to and from the reference control circuit 22.

In the case of an L-level of the row address Xi, normal cells contained in the memory cell arrays (data-bit-use cell array 31a and check-bit-use cell array 32a) on the left side form accessing targets.

In the case of an H-level of the row address Xi, normal cells contained in the memory cell arrays (data-bit-use cell array 31b and check-bit-use cell array 32b) on the right side form accessing targets.

In the case when the reference memory cells are used for the accessing targets, the reference control circuit 22 does not take the value of the row address Xi into consideration.

In the case when the reference memory cells contained in the memory cell arrays on the left side (data-bit-use cell array 31a and check-bit-use cell array 32a) form the accessing targets, the reference memory cell selection RSL is controlled to the H-level by the chip control circuit 13.

In the case when the reference memory cells contained in the memory cell arrays on the right side (data-bit-use cell array 31b and check-bit-use cell array 32b) form the accessing targets, the reference memory cell selection signal RSR is controlled to the H-level by the chip control circuit 13.

In accordance with the input signals (row addresses Xi, /Xi and reference memory cell selection signals RSL, RSR), the reference control circuit 22 generates reference control signals SWL, SWR, REL and RER.

In the case when normal cells contained in the memory cell arrays on the left side form the accessing targets, the control signal SWL is controlled to the L-level, the control signal SWR to the H-level, the control signal REL to the L-level, and the control signal RER is controlled to the H-level.

In the case when normal cells contained in the memory cell arrays on the right side form the accessing targets, the control signal SWL is controlled to the H-level, the control signal SWR to the L-level, the control signal REL to the H-level, and the control signal RER is controlled to the L-level.

In the case when reference memory cells contained in the memory cell arrays on the left side form the accessing targets, the control signal SWL is controlled to the L-level, the control signal SWR to the H-level, the control signal REL to the H-level, and the control signal RER is controlled to the H-level.

In the case when reference memory cells contained in the memory cell arrays on the right side form the accessing targets, the control signal SWL is controlled to the H-level, the control signal SWR to the L-level, the control signal REL to the H-level, and the control signal RER is controlled to the H-level.

Additionally, in FIG. 3(b), each of the row addresses Xi and /Xi at the time of selecting a reference memory cell is denoted by "x" indicating "don't care".

Figure 4:
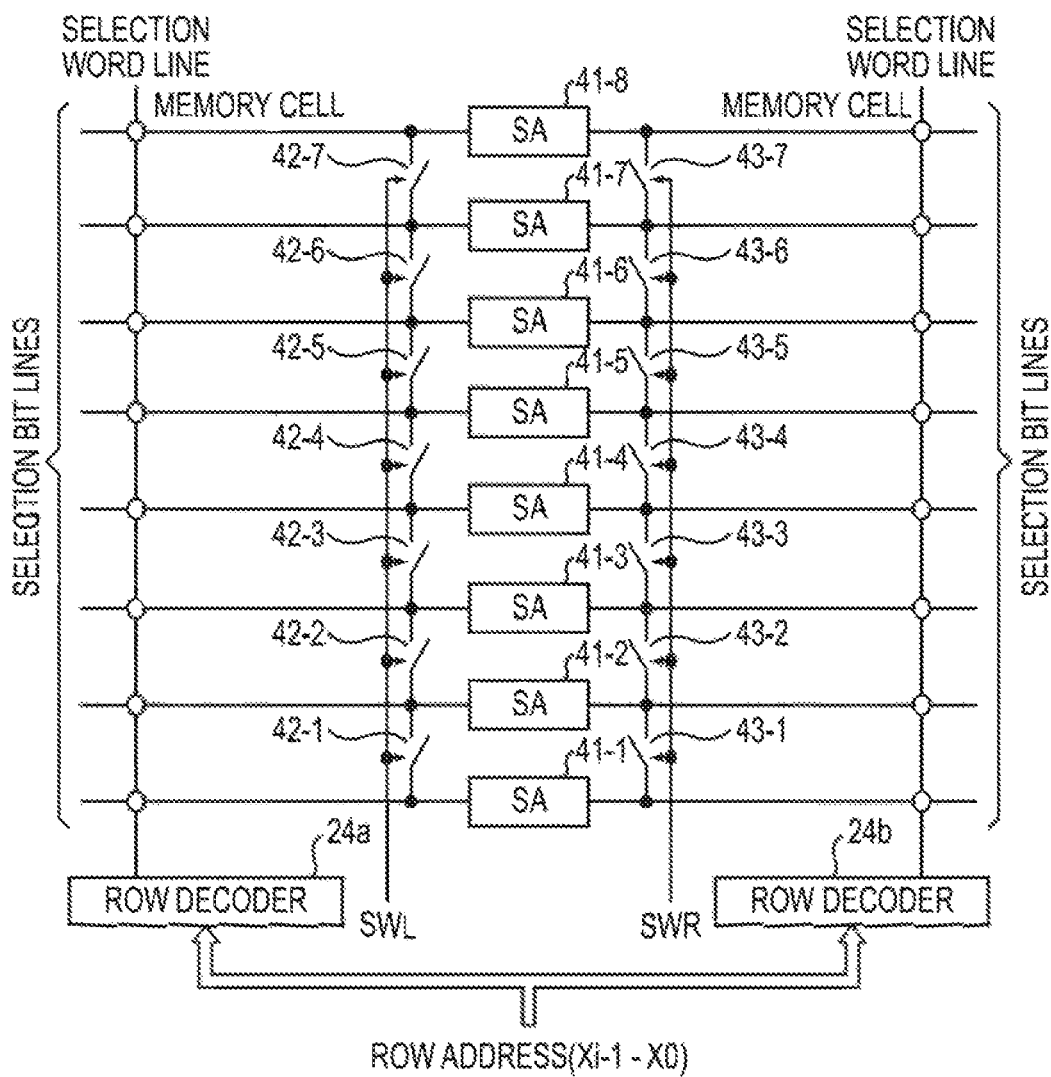
FIG. 4 shows one example of a schematic view showing one portion of a control circuit for use in reading out data from a memory cell.

FIG. 4 shows one portion of a control circuit for use in reading data from a normal memory cell.

In the case when data are read out from the memory cell, a plurality of sense amplifiers (SA; Sense Amplifier) 41-1 to 41-8, switches 42-1 to 42-7 and switches 43-1 to 43-7 are used.

The sense amplifier 41 is a differential amplifier, and a selection bitline for extending a memory cell array on the left side is connected to one of differential input terminals, with a selection bitline for extending a memory cell array on the right side being connected to the other differential input terminal.

As will be described later in detail, the selection bitline corresponds to a bitline selected by a selector circuit (not shown) as one of normal bitlines or one of reference bitlines from an aggregate of bitlines, with n number of normal bitlines and one reference bitline being formed as one set.

The switch 42 is connected between the differential input terminals connected to the selection bitline for extending the memory cell array on the left side, which correspond to the differential input terminals of adjacent sense amplifiers 41.

The switch 42 is controlled in its conductive and non-conductive states by the reference control signal SWL outputted by the reference control circuit 22. More specifically, the switch 42 becomes conductive when the reference control signal SWL is in the H-level.

In the same manner as in the switch 42, the switch 43 is also connected between the differential input terminals connected to the selection bitline for extending the memory cell array on the right side, which correspond to the differential input terminals of adjacent sense amplifiers 41. The switch 43 becomes conductive when the reference control signal SWR is in the H-level.

Row addresses Xi-1 to X0 are supplied to the row decoders 24a and 24b. By decoding the row addresses Xi-1 to X0, the row decoder 24a determines a word line to be activated (determines a selection word line) from word lines for extending the memory cell array on the left side.

By decoding the row addresses Xi-1 to X0, the row decoder 24b determines a word line to be activated from word lines for extending the memory cell array on the right side.

The word lines to be selected by the row decoder 124a and the row decoder 24b have a complementary relationship. More specifically, the distance from the sense amplifier 41 of the word line selected by the row decoder 24a and the distance from the sense amplifier 41 of the word line selected by the row decoder 24b are coincident with each other.

When the row decoder 24a selects one of word lines, the row decoder 24b selects one of word lines located at a symmetrical position, with the sense amplifier 41 forming the center. By selecting the word line with the sense amplifier 41 forming the center, the normal cell and the reference memory cell, when seen from the sense amplifier, are allowed to have the same parasitic resistance and parasitic capacity; therefore, the sense margin of the differential sense amplifier is increased.

Reading Operation of Normal Cell

Figure 5:
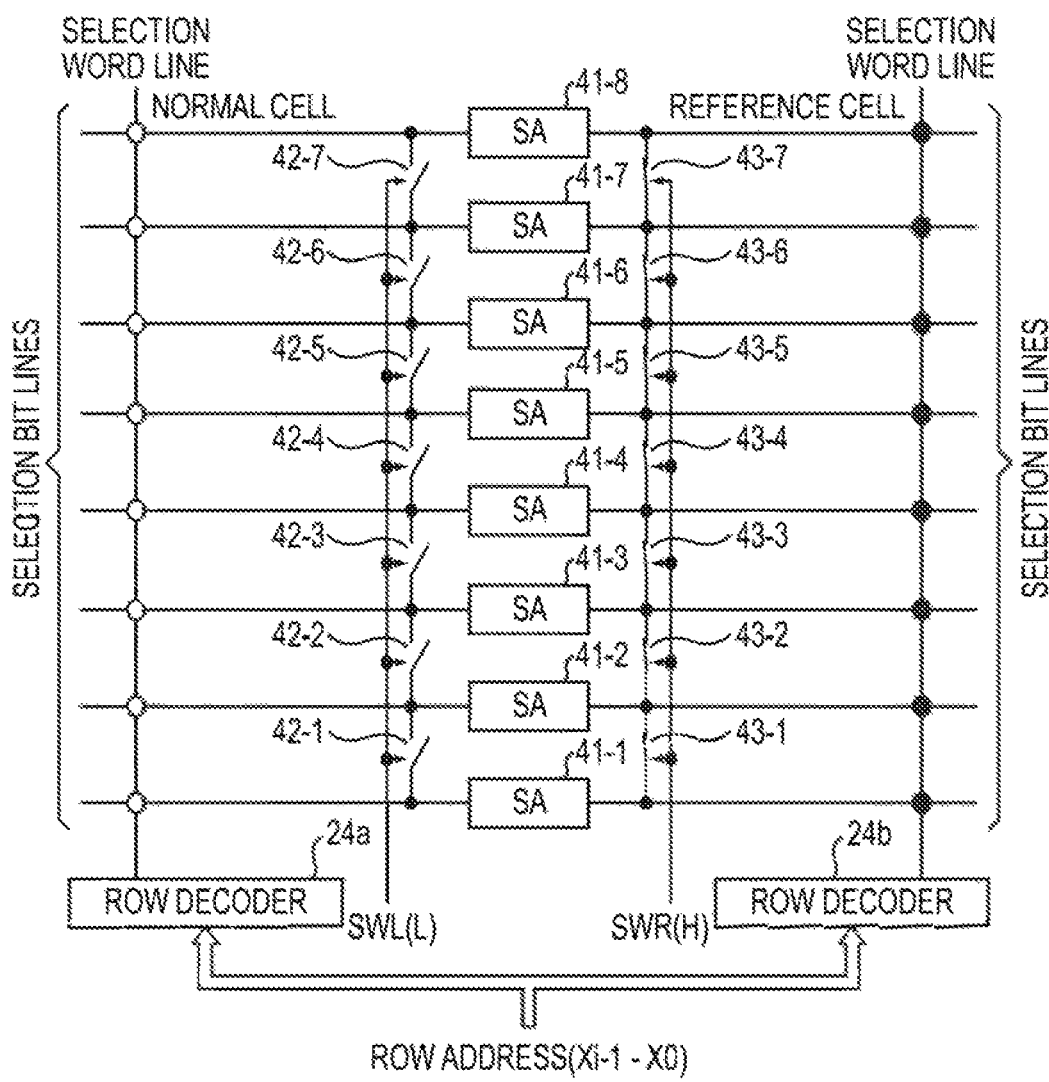
FIG. 5 is a view for use in explaining one example of a reading operation from a normal cell.

FIG. 5 is a view for use in explaining one example of reading operations from a normal cell on the left side. Additionally, in the following FIGS including FIG. 5, it is supposed that a white circle located at an intersection between a bitline and a word line represents a normal cell, with a black circle located at the same position representing a reference memory cell.

When the row decoder 24a on the left side selects one word line, 8 normal cells are connected to a selection bitline for extending the memory cell array on the left side. The row decoder 24b on the right side selects one of word lines located at a symmetrical position, with the sense amplifier 41 forming the center.

In the case when data are read from a normal cell included in the memory cell array on the left side, the reference control signal to be outputted from the reference control circuit 22 is controlled as shown by a first stage of FIG. 3(b). As will be described later in detail, since the reference control signal RER is controlled to the H-level, 8 reference memory cells are connected to a selection bitline for extending the memory cell array on the right side.

Since the reference control signal SWL is controlled to the L-level, the switch 42 is not turned on. On the other hand, since the reference control signal SWR is controlled to the H-level, the switch 43 is turned on so that the adjacent selection bitlines are short-circuited.

As a result, a reference voltage or a reference current is generated in the sense amplifier 41 by the reference memory cell on the right side.

In the case when normal cells included in the memory cell array on the right side are used as accessing targets, the reference control signal to be outputted from the reference control circuit 22 is controlled as shown by a second stage of FIG. 3(b). As a result operations which are obtained by replacing the right and left side of the above-mentioned operations with each other can be carried out.

Reading Operations of Reference Memory Cell on Left Side

Figure 6:
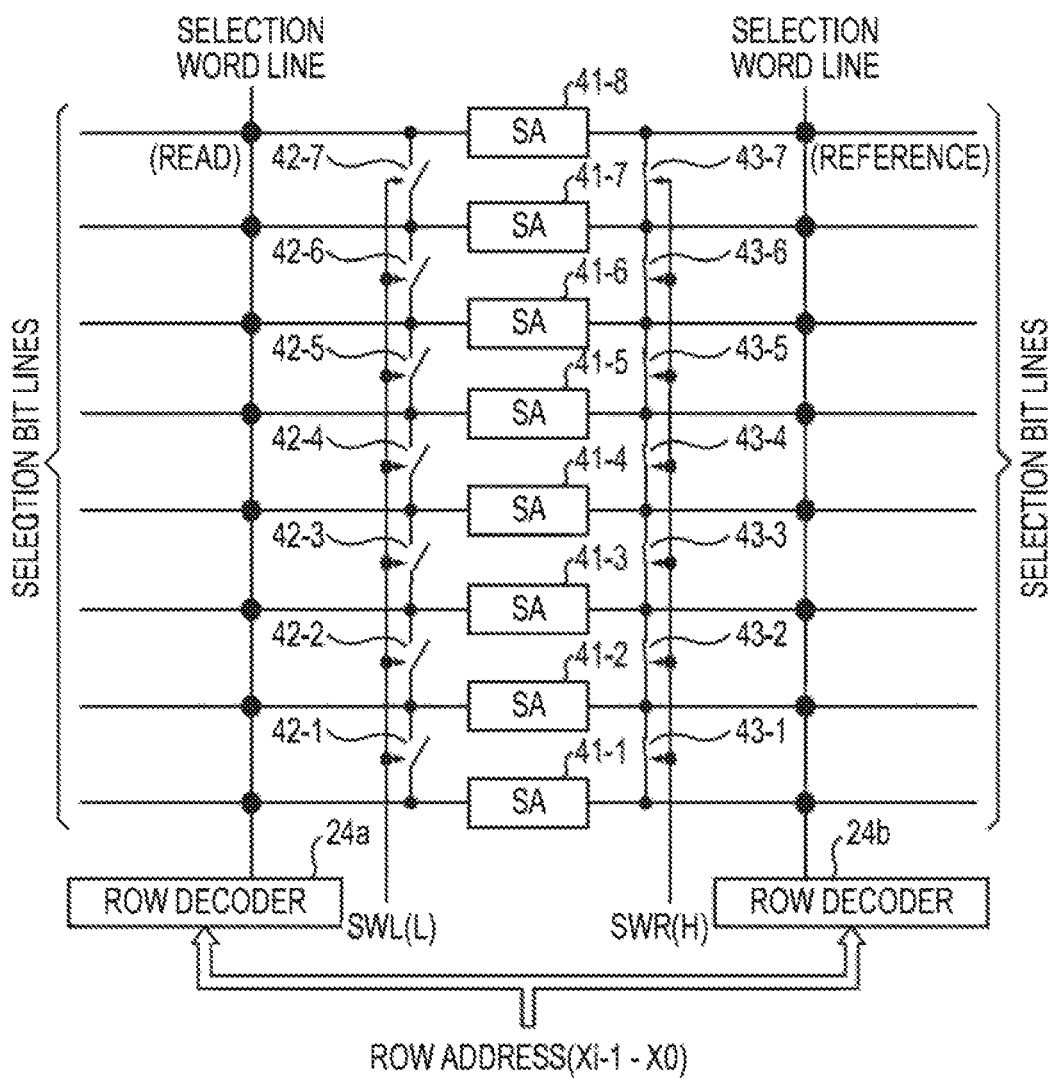
FIG. 6 is a view for use in explaining one example of a reading operation from a reference memory cell on the left side.

FIG. 6 is a view for use in explaining one example of reading operations from a reference memory cell on the left side.

In the case when data are read from a reference memory cell included in the memory cell array on the left side, the reference control signal to be outputted from the reference control circuit 22 is controlled as shown by a third stage of FIG. 3(b). As will be described later in detail, since the reference control signal REL is controlled to the H-level, 8 reference memory cells serving as the accessing targets are connected to a selection bitline on the left side.

Moreover, since the reference control signal RER is also controlled to the H-level, 8 reference memory cells are connected to the selection bitline on the right side.

Since the reference control signal SWL is controlled to the L-level and the reference control signal SWR is controlled to the H-level respectively reference data stored in the reference memory cell on the left side can be read, in the same manner as in the reading operation of the normal cell explained by reference to FIG. 5.

Reading Operations of Reference Memory Cell on Right Side

Figure 7:
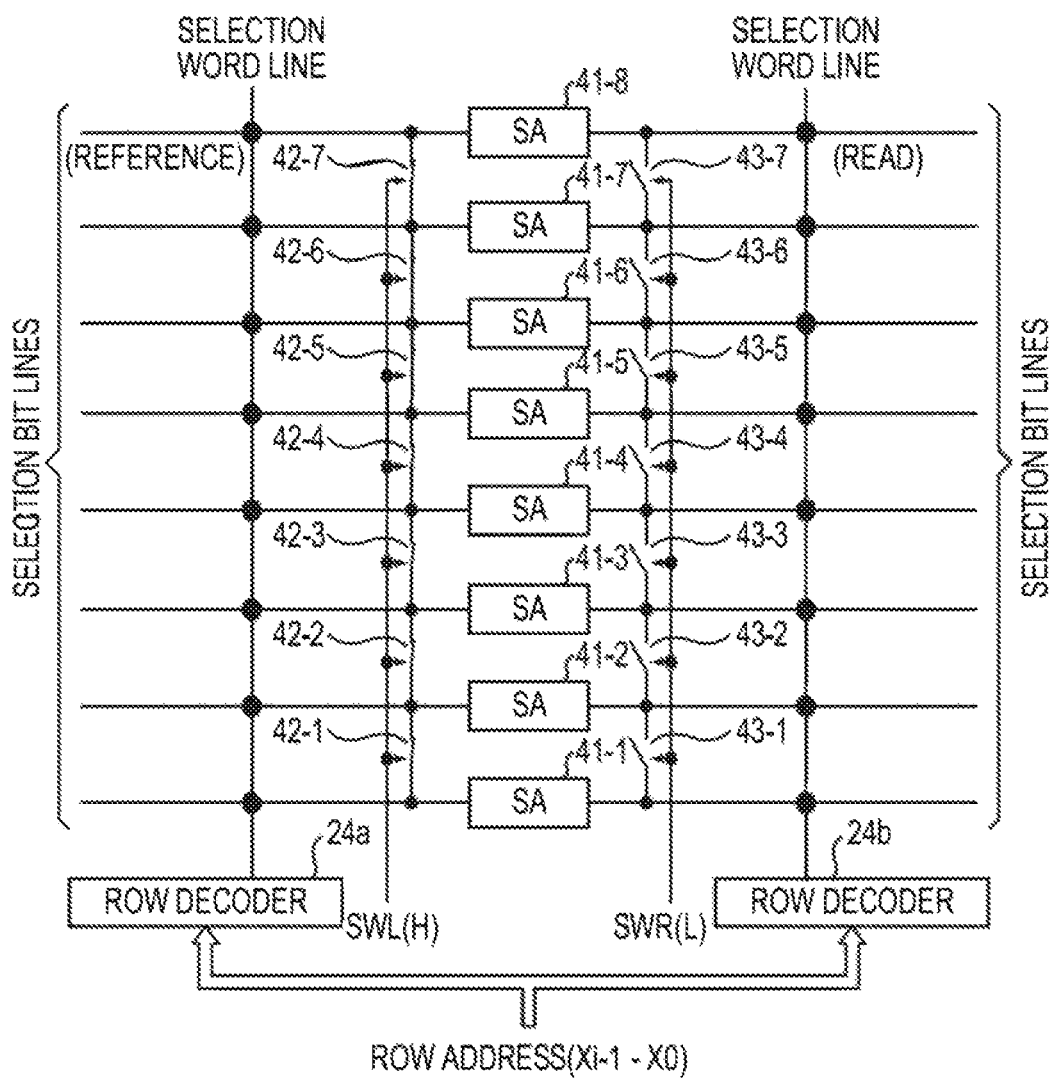
FIG. 7 is a view for use in explaining one example of a reading operation from a reference memory cell on the right side.

FIG. 7 is a view for use in explaining one example of reading operations from a reference memory cell on the right side.

In the case of reading operations from a reference memory cell on the right side, the reference control signal to be outputted from the reference control circuit 22 is controlled as shown by a fourth stage of FIG. 3(b). Since the reference control signal RER is controlled to the H-level, 8 reference memory cells serving as the accessing targets are connected to a selection bitline on the right side.

Since the reference control signal REL is also controlled to the H-level, 8 reference memory cells are connected to the selection bitline on the left side.

At this time, since the reference control signal SWL is set to the H-level and since the reference control signal SWR is set to the L-level, data can be read from the reference memory cells serving as the accessing targets on the right side in the same manner as in the normal cells.

Configuration of Memory Mat

Figure 8:
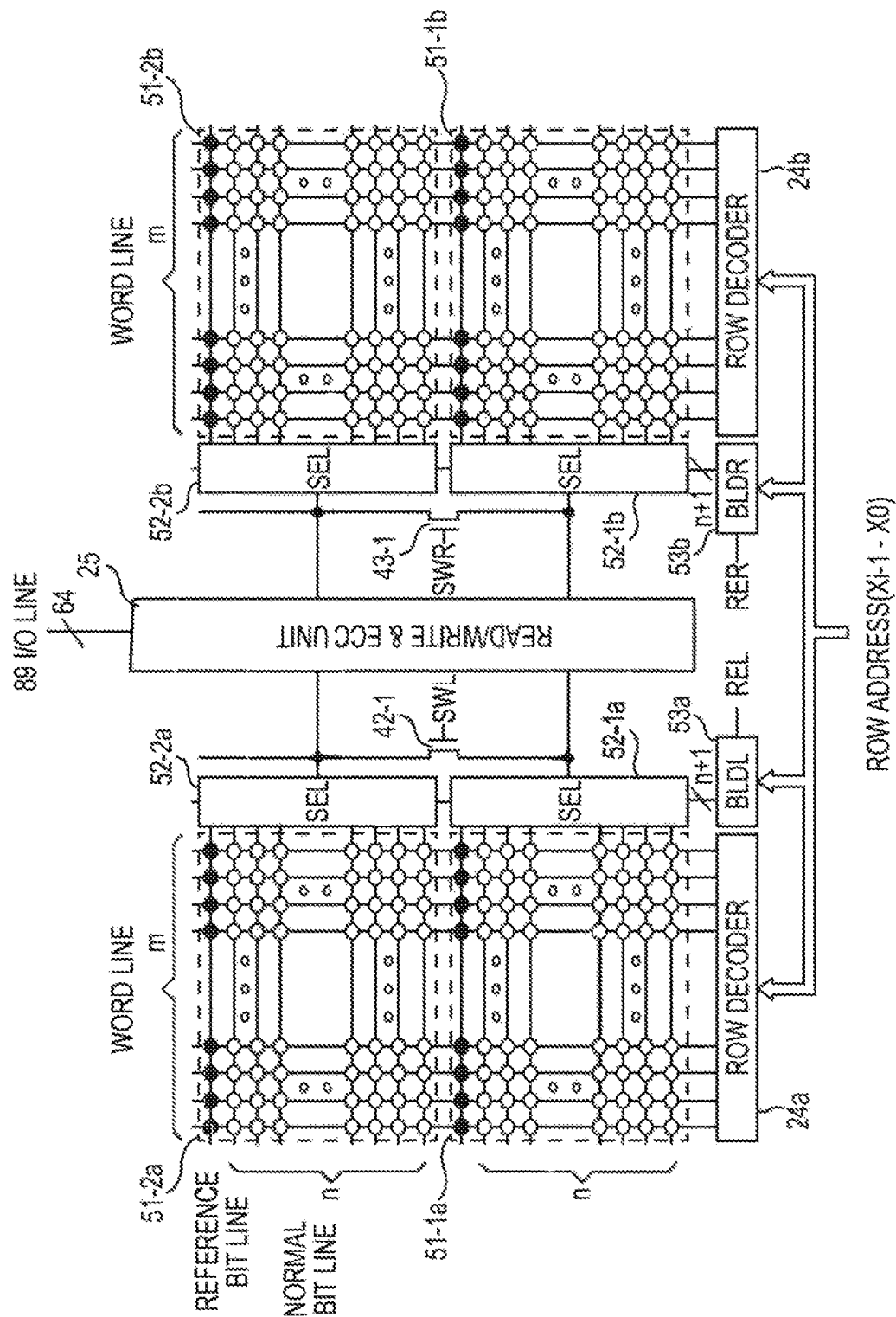
FIG. 8 is a view that schematically shows one example of a control circuit relating to a sense amplifier.

FIG. 8 is a view for use in schematically explaining one example of a control circuit relating to the sense amplifier.

By using FIG. 8, one example of the control circuit relating to the sense amplifiers 41-1 and 41-2 shown in FIG. 4 is explained.

The data-bet-use cell array 31 and check-bit-use cell array 32 explained by using FIG. 2 are constituted by a plurality of memory mats. More specifically, by using a memory mat in which m×(n+1) number of memory cells are disposed in a matrix shape as one unit, the data-bit-use cell array 31 and the check-bit-use cell array 32 are constituted. Additionally, both of in and n are positive integers, and the same is true for the following description.

More specifically, the data-bit-use cell array 31 includes 512 memory mats 51.

Moreover, the check-bit-use cell array 32 includes 10 memory mats 51. Additionally, the capacities of the data-bit-use cell array 31 and the check-bit-use cell array 32 are not intended to be limited, and the number of the memory mats included in the cell array may be changed on demand.

FIG. 8 shows memory mats 51-1a and 51-2a serving as one portion of the data-bit-use cell array 31a and memory mats 51-1b and 51-2b serving as one portion of the data-bit-use cell array 31b.

Each of the memory mats 51 includes normal cells for storing user data and reference memory cells for storing reference data. More specifically, each memory mat 51 includes n×m number of normal cells and in number of reference memory cells.

In this case, in number of word lines and n+1 number of bitlines are used for accessing processes to the memory cells included in each memory mat 51.

Of the n+1 number of bitlines, the n number of bitlines are used as normal bitlines for use in accessing to normal cells. Of the n+1 number of bitlines, one bitline is used as a reference bitline for use in accessing to a reference memory cell.

Selectors (SEL) 52-1a, 52-1b, 52-2a and 52-2b are disposed for each of the memory mats 51. The selector 52 selects one bitline of n+1 number of bitlines for extending the respective memory mats 51, and connects this to the read/write & ECC unit 25.

A selector control circuit (BLDL) 53a is a circuit for controlling a selection operation of a bitline by the selector 52-1a, 52-2a and the like on the left side.

To the selector control circuit 53a, a row address and the reference control signal REL are inputted.

Based upon the row address, the selector control circuit 53a allows each of the selectors 52-1a, 52-2a and the like to select one normal bitline from the n number of normal bitlines.

Based upon the reference control signal REL the selector control circuit 53a allows each of the selectors 52-1a, 52-2a and the like to select one of reference bitlines. In the case of the H-level of the reference control signal REL, the selector control circuit 53a connects the reference bitline to the read/write & ECC unit 25 through each selector 52-1a or the like irrespective of the value of the row address.

The selector control circuit (BLDR) 53b is also provided with the same function as that of the selector control circuit 53a. The selector control circuit 53b controls the respective selectors 52-1b, 52-2b and the like on the right side based upon the row address and the reference control signal RER.

Additionally, in the first embodiment, explanations have been given by exemplifying a case in which the selector control circuit 53 selects a bitline based upon the row address; however, the address to be supplied to the selector control circuit 53 is not intended to be limited by the row address. In the case when address information for use in selecting one normal bitline from n number of bitlines is contained in the column address, the selector control circuit 53 controls the respective selectors based upon a column address.

The row decoder 24a selects one word line from in number of word lines for extending the memory mats 51-1a, 51-2a and the like on the left side, based upon the row addresses Xi-1 to X0.

In the same manner, the row decoder 24b selects one word line from in number of word lines for extending the memory mats 51-1b, 51-2b and the like on the right side, based upon the row addresses Xi-1 to X0.

The read/write & ECC unit 25 includes sense amplifiers, and as described earlier, the input terminals of the adjacent sense amplifiers are designed to be connected to each other by the switch 42 and switch 43.

Read/Write & ECC Unit

Figure 9:
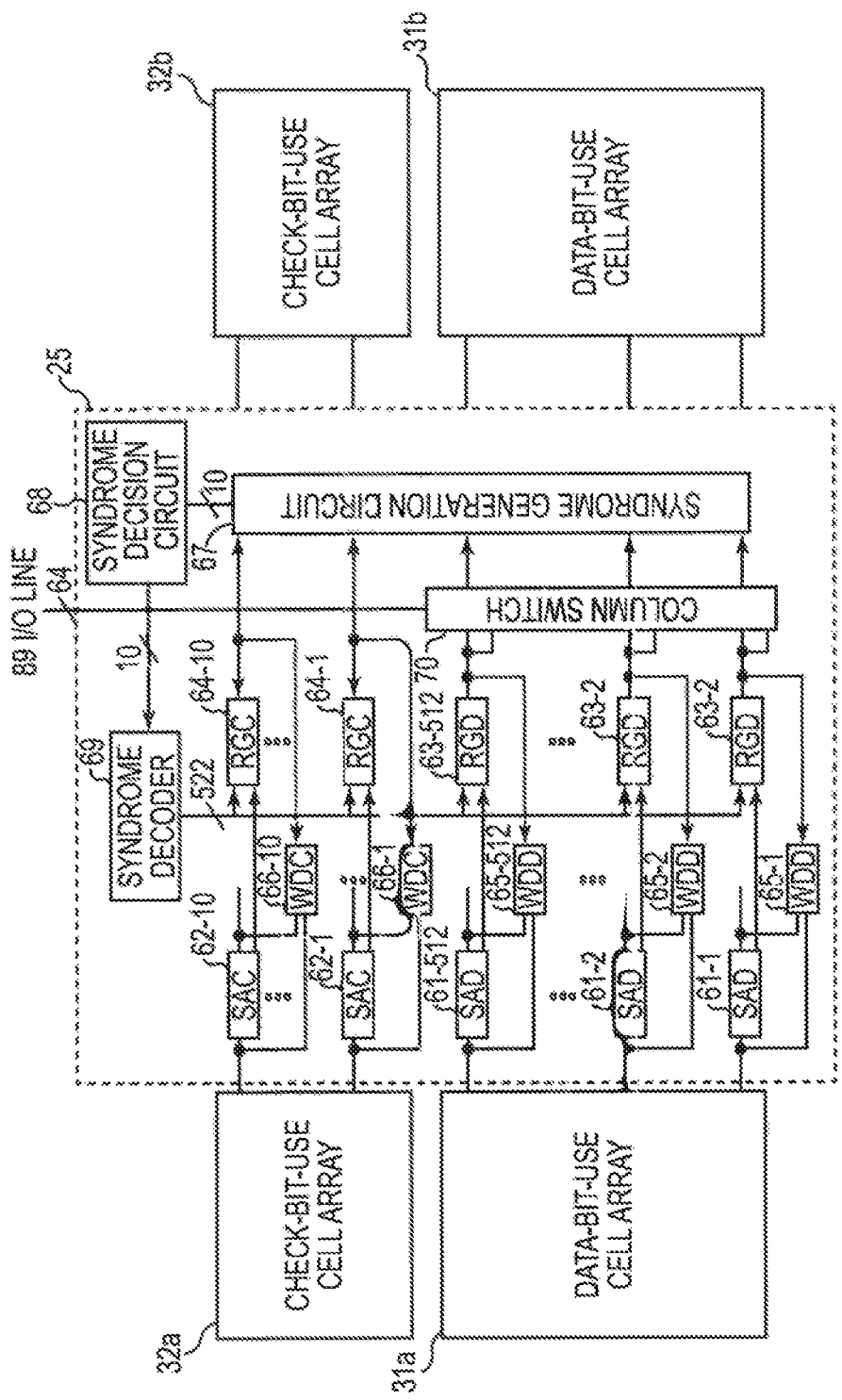
FIG. 9 is a view that schematically shows one example of a configuration of a read/write & ECC unit and the periphery thereof.

FIG. 9 is a view showing one example of the configuration of a read/write & ECC unit 25 and the periphery thereof. Additionally, in FIG. 9, the illustrations of the switches 42 and 43 are omitted.

As described earlier, on the right and left sides of the read/write & ECC unit 25, a data-bit-use cell array 31 and a check-bit-use cell array 32 are disposed.

In the present embodiment, explanations will be given on the premise that date (hereinafter, referred to as data bit) of 512 bits are outputted from the data-bit-use cell array 31 and correction codes (hereinafter, referred to as check bit) of 10 bits are outputted from the check-bit-use array 32. However the number of outputs from the respective cell arrays is not intended to be limited, and it is changed on demand depending on specifications or the like of the semiconductor device 1.

The read/write & ECC unit 25 includes a read/write circuit for executing data writing and data reading processes to and from memory cells and an ECC circuit for realizing ECC functions.

The read/write circuit included in the read/write & ECC unit 25 is present for each selection bitline selected from the data-bit-use cell array 31 and the check-bit-use cell array 32.

More specifically, 512 read/write circuits corresponding to the selection bitlines from the data-bit-use cell array 31 and 10 read/write circuits corresponding to the selection bitlines from the check-bit-use cell array 32 are contained in the read/write & ECC unit 25.

Each of the read/write circuits is constituted by a sense amplifier, a writing driver and a register.

Additionally, in FIG. 9, the sense amplifier corresponding to the data-bit-use cell array 31 is denoted as "SAD" and the sense amplifier corresponding to the check-bit-use cell array 32 is denoted as "SAC" so as to be distinguished from each other.

In the same manner, the writing driver corresponding to the data-bit-use cell array 31 is denoted as "WDD" and the writing driver corresponding to the check-bit-use cell array 32 is denoted as "WDC". The register corresponding to the data-bit-use cell array 31 is denoted as "RGD" and the register corresponding to the check-bit-use cell array 32 is denoted as "RGC".

To the differential input terminals of data-bit-use sense amplifiers 61-1 to 61-512, the input/output terminals of the respective selectors 52 (see FIG. 8) located on the right and left sides are connected. The output terminals of each of the data-bit-use sense amplifiers 61 are connected to the input terminals of the corresponding data-bit-use registers 63.

In the same manner, to the differential input terminals of check-bit-use sense amplifiers 62-1 to 62-10, the input/output terminals of the respective selectors 52 located on the right and left sides are connected. The output terminals of each of the check-bit-use sense amplifiers 62 are connected to the input terminals of the corresponding check-bit-use registers 64.

The input terminals of the data-bit-use writing drivers 65-1 to 65-512 are connected to the output terminals of the corresponding data-bit-use registers 63-1 to 63-512. Moreover, the output terminals of the data-bit-use writing drivers 65 are connected to the input/output terminals of the respective right and left selectors 52.

Although not shown in the FIGS., control signals SWL and SWR are inputted to the data-bit-use writing drivers 65 from the reference control circuit 22, and those arrays of the right and left data-bit-use cell arrays 31 that form the accessing targets are controlled so as to be subjected to the writing operation. For example, upon data rewriting at the time of error correction, the data writing targets by the data-bit-use writing drivers 65 correspond to the cells serving as the reading out targets in the proceeding readout operation.

In the same manner, the input terminals of the check-bit-use writing drivers 66-1 to 66-10 are connected to the output terminals of the check-bit-use registers 64-1 to 64-10. The output terminals of the check-bit-use writing drivers 66 are connected to the input/output terminals of the respective right and left selectors 52. Although not shown in FIGS., to the check-bit-use writing drivers 66, control signals SWL and SWR are inputted from the reference control circuit 22 so that those arrays of the right and left check-bit-use cell arrays 32 that form the accessing targets are controlled so as to be subjected to the writing operation.

The output terminals of the data-bit-use registers 63 are connected to the input terminal of the syndrome generation circuit 67, the input/output terminal of a column switch 70 and the input terminal of the data-bit-use writing driver 65. The output terminals of the check-bit-use registers 64 are connected to the input terminal of the syndrome generation circuit 67 and the input terminal of the check-bit-use writing driver 66.

The read/write & ECC unit 25 includes an ECC circuit constituted by the syndrome generation circuit 67, a decision circuit 68 and a syndrome decoder 69.

Additionally, in the present embodiment, the ECC functions are realized the ECC circuit constituted by the syndrome generation circuit 67, the decision circuit 68 and the syndrome decoder 69; however, the circuit configuration is not intended to be limited by these. The ECC circuit, circuits relating to this and signal paths for use in connecting these may be changed on demand.

The syndrome generation circuit 67 generates a syndrome of 10 bits from data bits of 512 bits inputted from the data-bit-use register 63 and check bits of 10 bits inputted from the check-bit-use resister 64. The syndrome generation circuit 67 outputs the generated syndrome to the syndrome decision circuit 68.

The syndrome generation circuit 67 generates the syndrome by using a hamming code provided with a 1-bit error correction capability. However, the correction capability and system of the syndrome to be generated are not intended to be limited thereby.

The decision circuit 68 determines whether or not any error occurs in the data bit and check bit from the inputted syndrome.

In the case when all the bits of the syndrome are 0, the decision circuit 68 determines that no error has occurred in the data bits having 512 bits and the check bits having 10 bits thus read out.

In the case when none of the bits of the syndrome are 0, the decision circuit 68 determines that any error has occurred in the data bits having 512 bits and the check bits having 10 bits thus read out. In the case of the presence of any error, the decision circuit 68 outputs the syndrome of 10 bits to the syndrome decoder 69.

The syndrome decoder 69 decodes the syndrome of 10 bits, and specifies a register (data-bit-use register or check-bit-use register) corresponding to the register having the error. The syndrome decoder 69 carries out an error correction by inverting the value possessed by the specified register.

Access to User Data

Referring to FIG. 9, the following description will discuss an accessing process to a normal cell contained in the data-bit-use cell array 31a on the left side.

When an active command is issued from the memory controller, a selected page by the memory controller is opened.

In this case, for example, when a normal cell contained in the data-bit-use cell array 31a on the left side forms the accessing target, 512 pieces of normal cells are selected from the data-bit-use cell array 31a and 10 pieces of check cells are selected from the check-bit-use cell array 32a, by the word line and the bitline selected by the row decoder 24a and the selector control circuit 53a.

Moreover, by the word line and bitline selected by the row decoder 24b and the selector control circuit 53b, 522 (512+10) pieces of reference memory cells are selected from the data-bit-use cell array 31b and the check-bit-use cell array 32b.

The data read out from the normal cells are inputted to one of the differential input terminals of each of the data-bit-use sense amplifiers 61-1 to 61-512 through the bitline. Moreover, the data read out from the reference memory cells of the data-bit-use cell array 31b are averaged by the switch 43, and inputted to the other differential input terminal of each of the data-bit-use sense amplifiers 61-1 to 61-512 as a reference signal.

The data read out from check cells of the check-bit-use cell array 32a are inputted to one of the differential input terminals of each of the check-bit-use sense amplifiers 62-1 to 62-10 through the bitline. Moreover, the data read out from the reference memory cells of the check-bit-use cell array 32b are averaged by the switch 43, and inputted to the other differential input terminal of each of the check-bit-use sense amplifiers 62-1 to 62-10 as a reference signal.

The data bits of 512 bits sense-amplified by the data-bit-use sense amplifiers 61-1 to 61-512 are written in the data-bit-use registers 63-1 to 63-512.

The check bits of 10 bits sense-amplified by the check-bit-use sense amplifiers 62-1 to 62-10 are written in the check-bit-use registers 64-1 to 64-10.

Error Detection and Correction

The data bits of 512 bits held by the data-bit-use registers 63-1 to 63-512 and the check bits of 10 bits held by the check-bit-use registers 64-1 to 64-10 are inputted to the syndrome generation circuit 67 so that a syndrome generation is carried out. The syndrome generated by the syndrome generation circuit 67 is inputted to the decision circuit 68.

In the case when all the bits of the syndrome inputted to the decision circuit 68 are 0, since an error detection indicating that no error has occurred in the data bits having 512 bits and the check bits having 10 bits that have been read out is obtained, no error correction is carried out by the syndrome decoder 69.

On the other hand, in the case when none of the bits of the syndrome inputted to the decision circuit 68 are 0, since the decision circuit 68 detects that any error is contained, an error correction is carried out by the syndrome decoder 69. For this reason, the decision circuit 68 outputs the syndrome received from the syndrome generation circuit 67 to the syndrome decoder 69.

The syndrome decoder 69 specifies a register (data-bit-use register or check-bit-use register) holding a bit having an error occurred therein from the received syndrome. The syndrome decoder 69 corrects the error by inverting the value held by the specified register.

Data Readout

When a readout command is given following the issue of the active command, a column switch 70 is controlled in accordance with a column address of an accessing target by the column decoder 23.

Of the 512 pieces of data-bit-use registers 63-1 to 63-512, the column switch 70 selects 64 pieces of data-bit-use registers and connects these to the I/O line 89.

The data held by the selected data-bit-use registers are sent to a read/write amplifier 16 and transmitted as readout data having 8 burst length from 8 pieces of data input/output buffers 18 through a parallel/serial conversion circuit 17.

Data Writing

When a writing command is given following the issue of the active command, writing data with 8-bit width and 8-bit burst length are inputted to the data input/output buffer 18.

When the writing data are inputted to the data input/output buffer 18, the column switch 70 is controlled in accordance with a column address of an accessing target by the column decoder 23.

Of the 512 pieces of data-bit-use registers 63-1 to 63-512, the column switch 70 selects 64 pieces of data-bit-use registers and connects these to the I/O line 89.

When the 64 pieces of the data-bit-use registers are selected, writing data given through the parallel/serial conversion circuit 17 are written in the data-bit-use register 63 selected from the read/write amplifier 16.

Thereafter, a syndrome corresponding to the writing data is generated by the syndrome generation circuit 67, and written in the check-bit-use registers 64-1 to 64-10.

Closing of Page

When a precharge command is given following (he issue of the active command, the data-bit-use writing drive 65 or the check-bit-use writing driver 66 writes data changed by the corresponding registers in the memory cells.

The data changed by the corresponding registers refer to data that are error-corrected, newly generated syndrome or externally written data of the data held by the data-bit-use register 63 or the check-bit-use register 64.

After having data-written in the memory cells, the word line selected by the row decoder 24a or 24b becomes a non-selected state, and the opened page is closed.

Scrubbing of Normal Cell

Referring to FIG. 9, the following description will discuss a scrubbing process to be carried out on normal cells contained in the data-bit-use cell array 31a and the check-bit-use cell array 32a on the left side.

In the case when a scrubbing command relative to normal cells is issued from the memory controller, a sequence of operations of a page opening operation, an error correcting operation, a writing operation of corrected data into memory cells and a page closing operation of the accessing operations to the normal cells are executed.

When a scrubbing command is issued from the memory controller, a page selected by the memory controller is opened.

In this case, in the same manner as described above, data bits of 512 bits sense-amplified by the data-bit-use sense amplifiers 61-1 to 61-512 are written in the data-bit-use registers 63-1 to 63-512. Check bits of 10 bits sense-amplified by the check-bit-use sense amplifiers 62-1 to 61-10 are written in the check-bit-use registers 64-1 to 64-10.

Thereafter, the data bits of 512 bits held by the data-bit-use registers 63-1 to 63-512 and the check bits of 10 bits held by the check-bit-use registers 64-1 to 64-10 are inputted to the syndrome generation circuit 67 so that a syndrome generation is carried out. The syndrome generated by the syndrome generation circuit 67 is inputted to the decision circuit 68.

In accordance with the decision result of the derision circuit 68, the syndrome decoder 69 specifies a register (data-bit-use register or check-bit-use register) holding erroneous data, if necessary, and carries out an error correction by inverting the value of data held therein.

Thereafter, if there is any data-bit-use register 63 holding corrected data, the data-bit-use writing drivers 65-1 to 65-512 write the corresponding corrected data in the normal cells of the data-bit-use cell array 31a. Alternatively, if there is any check-bit-use register 64 holding corrected data, the check-bit-use writing drivers 86-1 to 66-10 write the corresponding corrected data in the check cells of the check-bit-use cell array 32a.

Thereafter, the word line selected by the row decoder 24a or 24b becomes a non-selected state, and the opened page is closed.

In this manner, in the case when a scrubbing command is issued, an error correction (scrubbing) is carried out on data of the opened page so that corrected data are written in memory cells.

Scrubbing of Reference Memory Cell

Referring to FIG. 9, the following description will discuss a scrubbing process to be carried out on reference memory cells included in the data-bit-use cell array 31a and the check-bit-use cell array 32a on the left side.

In the case when a scrubbing command relative to reference memory cells is issued from the memory controller, a sequence of operations of a page opening operation, an error correcting operation, a writing operation of corrected data into memory cells and a page closing operation are executed.

When a scrubbing command relating to a reference memory cell is issued from the memory controller, a page selected by the memory controller is opened.

In this case, 512 pieces of reference memory cells are selected from the data-bit-use cell array 31$a$ by the word line and bitline selected by the row decoder 24$a$ and the selector control circuit 53$a$, and 10 pieces of reference memory cells are selected from the check-bit-use cell array 32$a$.

Moreover, by the word line and bitline selected by the row decoder 24$b$ and the selector control circuit 53$b$, 522 (512+10) pieces of reference memory cells are selected from the data-bit-use cell array 31$b$ and the check-bit-use cell array 32$b$.

The reference bits of 512 bits sense-amplified by the data-bit-use sense amplifiers 61-1 to 61-512 are written in the data-bit-use registers 63-1 to 63-512. The reference bits of 10 bits sense-amplified by the check-bit-use sense amplifiers 62-1 to 62-10 are written in the check-bit-use registers 64-1 to 64-10.

Thereafter, the reference bits of 512 bits held by the data-bit-use registers 63-1 to 63-512 and the reference bits of 10 bits held by the check-bit-use registers 64-1 to 64-10 are inputted to the syndrome generation circuit 67 so that a syndrome generation is carried out.

Additionally, the formation of the syndrome needs check bits corresponding to inputted reference bits of 522 bits.

In this case, reference memory cells located in the data-bit-use cell array 31 are disposed so as to alternately store data "0" and data "1", and the readout data row has repetitive data "0" and data "1". Moreover, the same is true for the check-bit-use cell array 32, and in a data row read out from the check-bit-use cell array 32, 5 pieces of data "0" and 5 pieces of data "1" appear alternately. Therefore, by appropriately selecting an inspection matrix (H matrix) to be used in the syndrome generation circuit 67, data read out from the reference memory cells of the check-bit-use cell array 32 can be regarded as check bits corresponding to reference bits read out from the data-bit-use cell array 31. That is, the reference memory cells included in the check-bit-use cell array 32 can be used as reference memory cells and also as check cells.

The syndrome generation circuit 67 outputs the generated syndrome to the decision circuit 68.

The decision circuit 68 determines whether or not any error has occurred in the data read out from the reference memory cells. In other words, the decision circuit 68 executes an error detection operation to determine whether or not the data of the reference memory cells are erroneous.

The syndrome decoder 69 refers to the decision result of the decision circuit 68, and if necessary, specifies a register (data-bit-use register or check-bit-use register) having the erroneous data so that by inverting the value of the held data, an error correction is carried out. That is, the syndrome decoder 69 executes the error correction operation for correcting data to be stored in the reference memory cell corresponding to the error detected by the decision circuit 68.

Thereafter, if the corrected data are present, the data-bit-use writing drivers 65-1 to 65-512 write the corresponding corrected data in the reference memory cells of the data-bit-use cell array 31$a$. Alternatively, if the corrected data are present, the check-bit-use writing drivers 66-1 to 66-10 write the corresponding corrected data in the reference memory cells of the check-bit-use cell array 32$a$.

Next, the word line that has been selected by the row decoders 24$a$ and 24$b$ becomes a non-selected state so that the opened page is closed and the scrubbing process relative to the reference memory cells is terminated.

As described above, the semiconductor device 1 relating to the present embodiment is designed such that when a reference memory cell stores erroneous data, data individually stored in a plurality of memory cells can be read out, and by correcting the corresponding erroneous data by using an ECC function, the corrected data are again returned to the reference memory cells. At this time, since the corrected data are written only in the reference memory cell which stores the erroneous data, the writing frequency to the reference memory cells is reduced in comparison with a system in which the reference memory cells are overwritten regularly without checking whether or not erroneous data are stored in the reference memory cells. By reducing the writing frequency to the reference memory cells, it becomes possible to improve the reliability of the reference memory cells.

In the semiconductor memory of STT-RAM or the like, stored data in the normal memory cells and reference memory cells tend to be suddenly inverted in some cases, due to thermal instability caused by a material forming the storing layer and a device structure and influences by a noise voltage, a noise current or the like. In such a case, it becomes effective to carry out a correction by checking stored data of the individual memory cells.

The above-mentioned description has explained in detail about a readout method of stored data in the reference memory cells, by exemplifying a configuration which is formed by array-disposing completely the same memory cell arrays having reference memory cells and normal cells on the two sides of a sense amplifier row, with the reference memory cells being connectable to two differential input nodes of the sense amplifier. In the case when upon carrying out a normal reading/writing operation, the reference memory cell is connected only to one of differential input nodes of a sense amplifier, with only the normal cells being connected to the other, a normal cell can be used in place of the aforementioned reference memory cell for use in forming reference information when the stored data in the reference memory cell are read out. For example, normal cells for use in reference memory cells of the same number in which data "0" and data "1" are preliminarily written are prepared, and by connecting these in parallel with each other to the differential input nodes of the sense amplifier, the object of this configuration is achieved.

Second Embodiment

In the first embodiment, an error detection relating to reference data and its correction are carried out by using an ECC circuit. In a semiconductor device 1 in accordance with a second embodiment, a configuration having no ECC circuit will be explained.

Figure 10:
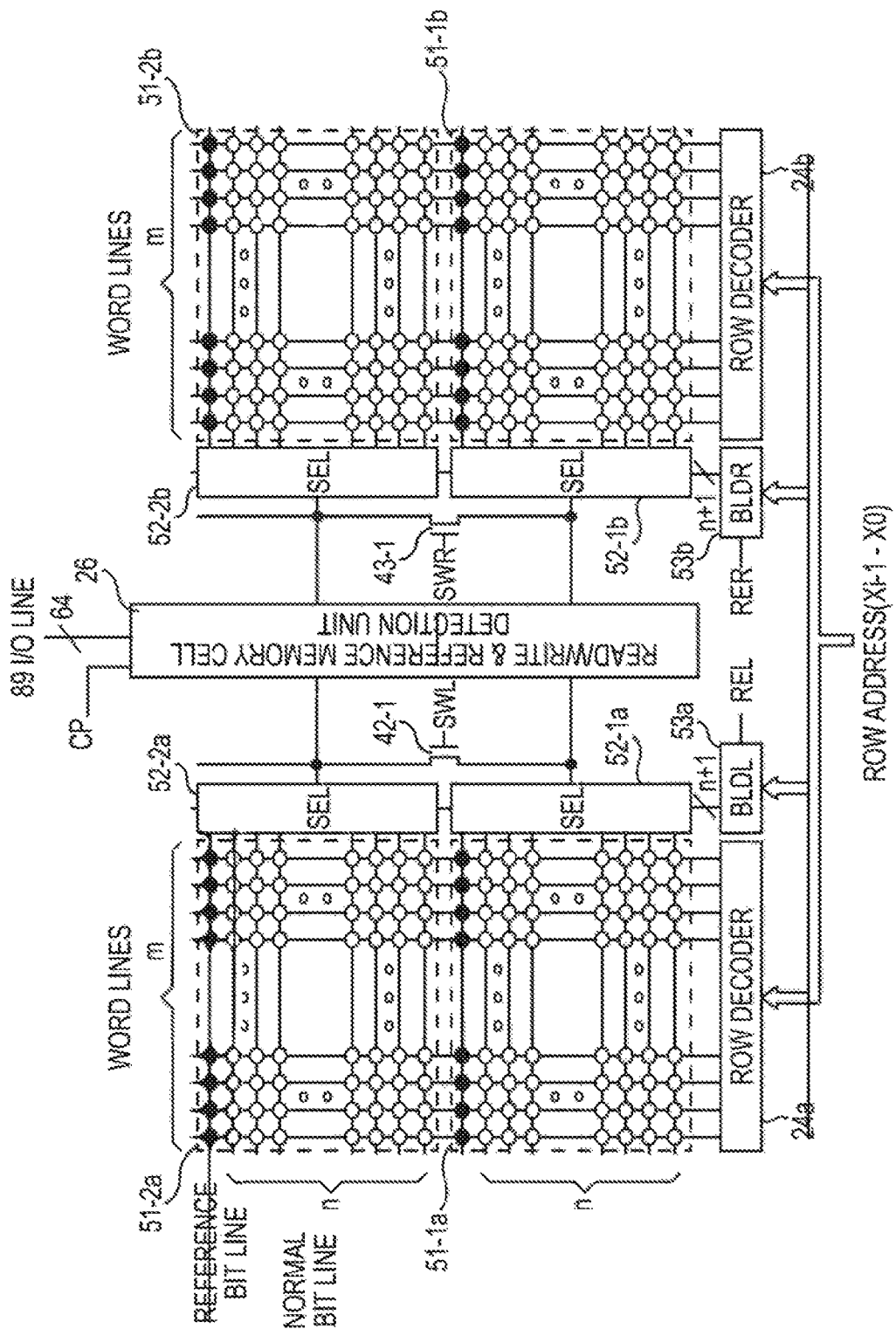
FIG. 10 is a view that schematically shows one example of a control circuit relating to a sense amplifier in accordance with a second embodiment.

FIG. 10 is a view that schematically shows one example of a control circuit relating to sense amplifiers 41-1 and 41-2 in accordance with the second embodiment. In FIG. 10, those constituent elements that are the same as those of FIG. 1 are indicated by the same reference numerals, and the description thereof will be omitted.

The configuration shown in FIG. 8 differs from the configuration shown in FIG. 10 in that in place of the read/write & ECC unit 25, a read/write & reference memory cell detection unit 26 is installed.

Moreover, the chip control circuit 13 (see FIG. 1) generates a compare mode setting signal CP and supplies this signal to the read/write & reference memory cell detection unit 26. Alternatively, in accordance with a control signal outputted by the chip control circuit 13, the reference control circuit 22 may generate the compare mode setting signal CP.

Upon carrying out a scrubbing process on reference memory cells, the chip control circuit 13 sets the compare mode setting signal CP to an H-level serving as an activation level.

Figure 11:
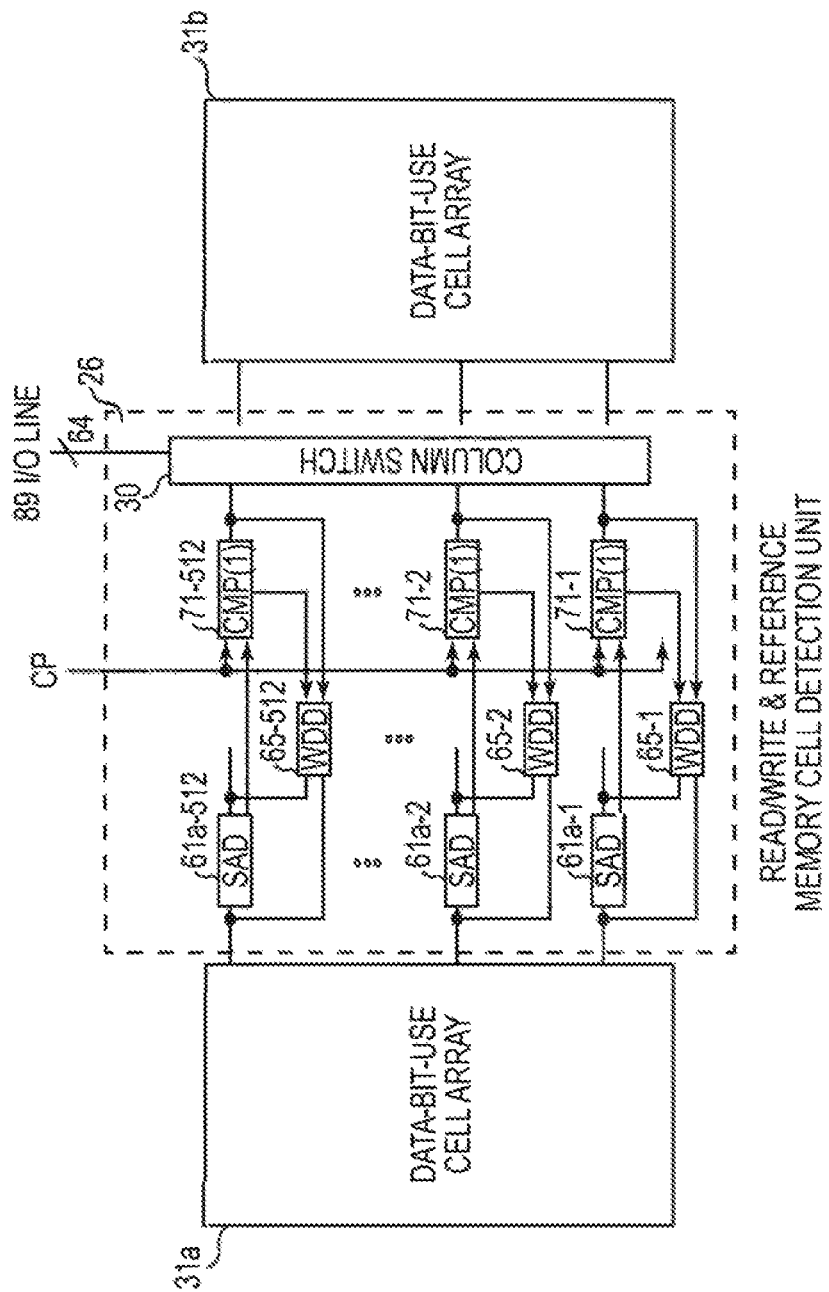
FIG. 11 is a view that shows one example of a read/write & reference memory cell inspection unit and the periphery thereof.

FIG. 11 is a view showing one example of the configuration of the read/write & reference memory cell inspection unit 26 and the periphery thereof. In FIG. 11, those constituent elements that are the same as those of FIG. 9 are indicated by the same reference numerals, and the explanation thereof will be omitted.

Since no error correction using the ECC function is carried out, there are no check-bit-use cell arrays 32*a*, 32*b* in the memory cell array 2 of the semiconductor device 1 in accordance with the second embodiment. Moreover, there are no ECC circuit blocks (including the syndrome generation circuit 67, decision circuit 68 and syndrome decoder 69) as well.

The read/write & reference memory cell inspection unit 26 is provided with comparison circuits 71-1 to 71-512. Additionally, the data-bit-use sense amplifier 61*a* is supposed to have the function of the data-bit-use sense amplifier 61 as well as the function of the data-bit-use register 63 explained in the first embodiment. However, the configuration of the read/write & reference memory cell inspection unit 26 is not intended to be limited thereby, and it may have a configuration provided with the data-bit-use sense amplifier and the data-bit-use register in the same manner as in the first embodiment.

The comparison circuit 71 is a circuit for comparing reference data that have been read out with data in which data "1" and data "0" are preliminarily set, and if the result of comparison shows non-coincidence, it generates an error signal. In addition, in FIG. 1, the comparison circuit is denoted as "CMP", and predetermined data are denoted in parallel therewith as "word in parentheses".

The comparison circuit 71 with data "0" set therein and the comparison circuit 71 with data "1" set therein are alternately disposed.

Each of the comparison circuits 71 receives a compare mode setting signal CP. Moreover, each comparison circuit 71 is connected to the data-bit-use sense amplifier 61*a*, the data-bit-use writing driver 65 and the column switch 70.

In the case when the compare mode setting signal CP is the L-level, the comparison circuit 71 carries out a normal operation (data readout operation from a normal cell and data writing operation to a normal cell).

In the case when the compare mode setting signal CP is the L-level, the comparison circuit 71 outputs the data read out from the normal cell to the column switch 70. Alternatively, in the case when the compare mode setting signal CP is the L-level. the comparison circuit 71 connects the column switch 70 and the data-bit-use writing driver 65 with each other. In the case when the compare mode setting signal CP is the H-level, the comparison circuit 71 carries out a comparing operation.

In the case when the compare mode setting signal CP is the H-level the comparison circuit 71 compares preliminarily set data with the readout data from the data-bit-use sense amplifier 61*a*, and if the result of comparison shows non-coincidence, it outputs an error signal and the corrected data to the data-bit-use writing driver 65.

Figure 12:
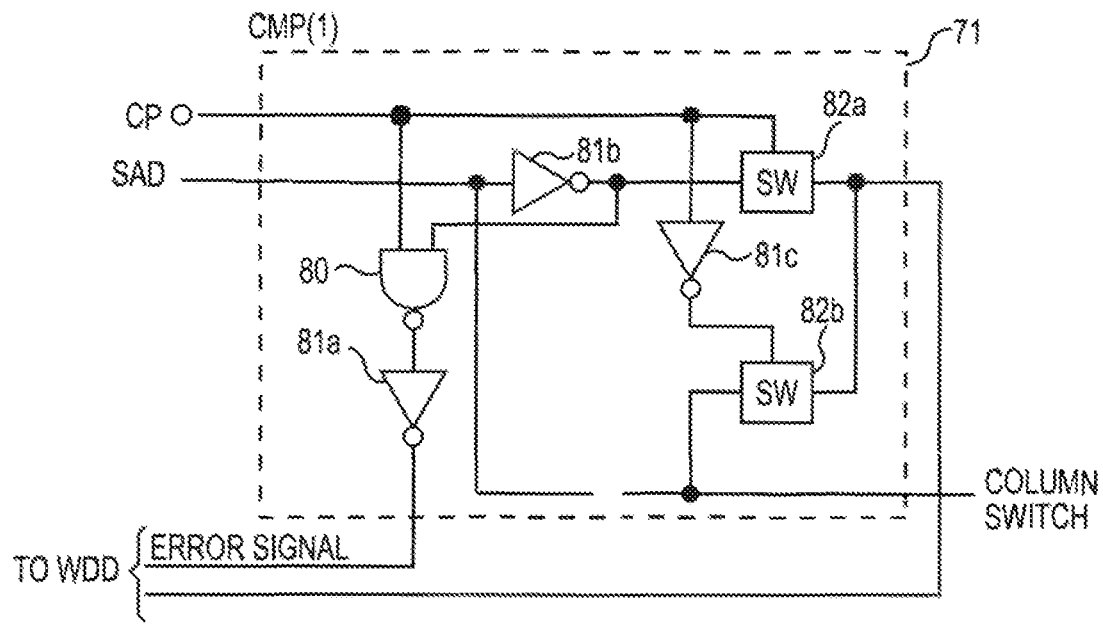
FIG. 12 is a view that shows one example of a circuit configuration of a comparison circuit with data "1" set therein.

FIG. 12 is a view showing one example of a circuit configuration of the comparison circuit 71 with data "1" set therein.

By reference to FIG. 12, the comparison circuit 71 with data "1" set therein is constituted by a NAND circuit 80. inverter circuits 81*a* to 81*c* and switches 82*a* and 82*b*.

The NAND circuit 80 receives the compare mode setting signal CP and a signal obtained by inverting readout data from the data-bit-use sense amplifier 61*a* by using the inverter circuit 81*b*.

The output of the NAND circuit 80 is inverted by the inverter circuit 81*a* and outputted to the data-bit-use writing driver 65 as an error signal.

The readout data from the data-bit-use sense amplifier 61*a* are supplied to the inverter 81*b* as well as to the column switch 70.

Figure 13:
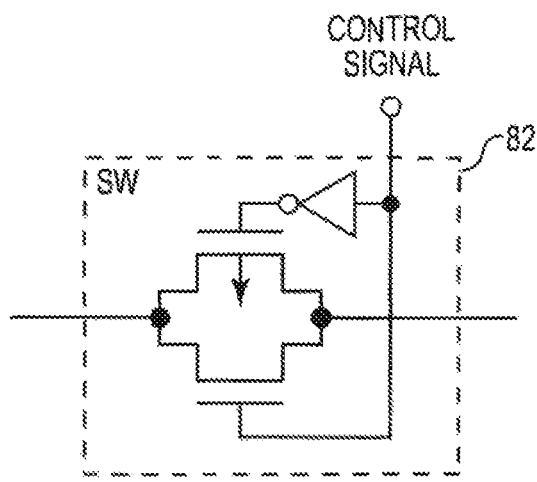
FIG. 13 is a view showing one example of a circuit configuration of a switch.

The switches 82*a* and 82*b* are switches whose two terminals are set to a conductive/non-conductive state in accordance with the control signal. As both of the switches 82*a* and 82*b*, a transfer gate (see FIG. 13) constituted by a PMOS transistor and an NMOS transistor may be used.

The switch 82*a* is connected between the inverter circuit 81*b* and the data-bit-use writing driver 65. The switch 82*a* receives the compare mode setting signal CP as the control signal.

The switch 82*b* is connected between the data-bit-use sense amplifier 61*a*, as well as the column switch 70, and the data-bit-use writing driver 65. The switch 82*b* receives a signal obtained by inverting the compare mode setting signal CP by using the inverter circuit 81*c* as the control signal.

Figure 14:
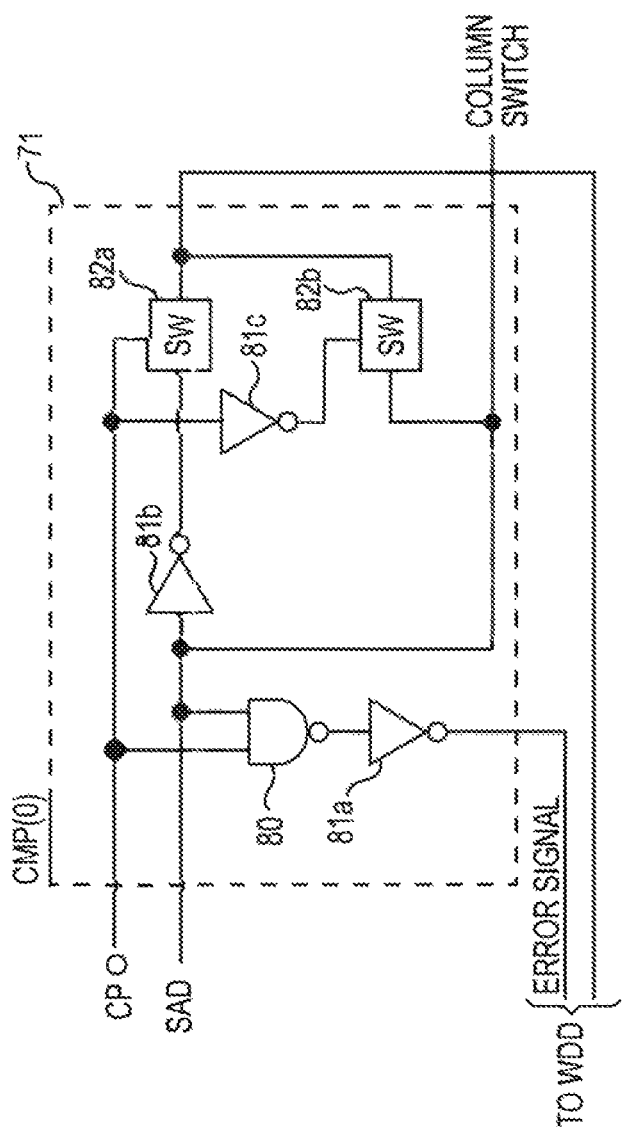
FIG. 14 is a view that shows one example of a circuit configuration of the comparison circuit with data "0" set therein.

FIG. 14 is a view showing one example of a circuit configuration of the comparison circuit 71 with data "0" set therein.

The comparison circuit 71 with data "0" set therein also includes the same constituent elements as those of the comparison circuit 71 with data "1" set therein.

The difference between the comparison circuit 71 with data "0" set therein and the comparison circuit 71 with data "1" set therein lies in whether the NAND circuit 80 receives the inversion signal of the data-bit-use sense amplifier 61*a* or the output signal of the data-bit-use sense amplifier 61*a*.

Normal Operation

In a normal operation, the compare mode setting signal CP is set to the L-level. Referring to FIGS. 12 and 14, the following description will discuss operations of the comparison circuit 71 in the case when the compare mode setting signal CP is the L-level.

When the compare mode setting signal CP is the L-level, the switch 82*a* becomes non-conductive, while the switch 82*b* becomes conductive. Therefore, the readout data from the data-bit-use sense amplifier 61*a* are supplied to the column switch 70. Alternatively, the writing data from the column switch 70 are supplied to the data-bit-use writing driver 65.

Additionally, since the compare mode setting signal CP is the L-level, the output from the NAND circuit 80 is the H-level irrespective of the output of the data-bit-use sense amplifier 61*a* so that the inversion signal by the inverter circuit 81*a* (error signal) is set to the L-level. Therefore, in the case when the compare mode setting signal CP is the L-level, the error signal is not generated from the comparison circuit 72.

Comparing Operation

In the comparing operation, the compare mode setting signal CP is the H-level. Referring to FIGS. 12 and 14, the following description will discuss operations of the comparison circuit 71 in the case when the compare mode setting signal CP is the H-level.

In the case when the compare mode setting signal CP is the H-level, the switch 82a becomes conductive, while the switch 82b becomes non-conductive. Since the switch 82b is non-conductive, writing data from the column switch 70 are not supplied to the data-bit-use writing driver 65.

In FIG. 12, suppose that reference data with data "1" set therein are read out from the data-bit-use sense amplifier 61a relative to the comparison circuit 71 with data "1" set therein.

In this case, since the compare mode setting signal CP of the H-level and the L-level signal inverted by the inverter circuit 81b are inputted to the NAND circuit 80, the output of the inverter circuit 81a becomes the L-level. Therefore, in this case, no error signal is generated by the comparison circuit 71.

On the other hand, suppose that reference data with data "0" set therein are read out from the data-bit-use sense amplifier 61a relative to the comparison circuit 71 with data "1" set therein.

In this case, since the compare mode setting signal CP of the H-level and the H-level signal inverted by the inverter circuit 81b are inputted to the NAND circuit 80, the output of the inverter circuit 81a becomes the H-level. Therefore, in this case, an error signal relative to the data-bit-use writing driver 65 is generated by the comparison circuit 71.

Moreover, since the switch 82a is made conductive by the compare mode setting signal CP, a signal (H-level signal) obtained by inverting data "0" read out from the data-bit-use sense amplifier 61a is supplied to the data-bit-use writing driver 65.

Since the error signal is the H-level, the data-bit-use writing driver 65 writes corrected data (in this case, data "1") supplied from the comparison circuit 71 in the reference memory cell.

In FIG. 14, suppose that reference data with data "0" set therein are read out from the data-bit-use sense amplifier 61a relative to the comparison circuit 71 with data "0" set therein.

In this case, since the compare mode setting signal CP of the H-level and the readout data from the data-bit-use sense amplifier 61a of the L-level are inputted to the NAND circuit 80, the output of the inverter circuit 81a becomes the L-level. Therefore, in this case, no error signal is generated by the comparison circuit 71.

On the other hand, suppose that reference data with data "1" set therein are read out from the data-bit-use sense amplifier 61a relative to the comparison circuit 71 with data "0" set therein.

In this case, since the compare mode setting signal CP of the H-level and the readout data from the data-bit-use sense amplifier 61a of the H-level are inputted to the NAND circuit 80, the output of the inverter circuit 81a becomes the H-level. Therefore, in this case, an error signal relative to the data-bit-use writing driver 65 is generated by the comparison circuit 71.

Moreover, since the switch 82a is made conductive by the compare mode setting signal CP, a signal (L-level signal) obtained by inverting data "1" read out from the data-bit-use sense amplifier 61a is supplied to the data-bit-use writing driver 65.

Since the error signal is the H-level, the data-bit-use writing driver 65 writes corrected data (in this case, data "0") supplied from the comparison circuit 71 in the reference memory cell.

Although not illustrated in FIG. 11, control signals SWL and SWR are inputted to the data-bit-use writing driver 65 from the reference control circuit 22 so that one of the right and left data-bit-use arrays 31 that forms the accessing target is controlled so as to be subjected to a writing operation.

Even in the case of the semiconductor device 1 of the second embodiment without having the ECC function, by comparing data read out from a reference memory cell serving as an accessing target and data preliminarily set in the comparison circuit 71, only the memory cell corresponding to non-coincident bit may be overwritten by correct data. That is, even in the case of the semiconductor device 1 in which no ECC operation is executed on the basis of a page unit, by comparing stored data read out from the reference memory cell with preliminarily set data, an error detection of reference data and its correction can be carried out. Therefore, in the same manner as in the first embodiment, the writing frequency onto reference memory cells is reduced so that the reliability of the reference memory cells is improved.

Third Embodiment

The comparison circuit 71 that has been explained in the second embodiment is exemplary only. In the present embodiment, a comparison circuit having a circuit configuration that is different from that of the comparison circuit 71 explained in the second embodiment will be explained.

Figure 15:
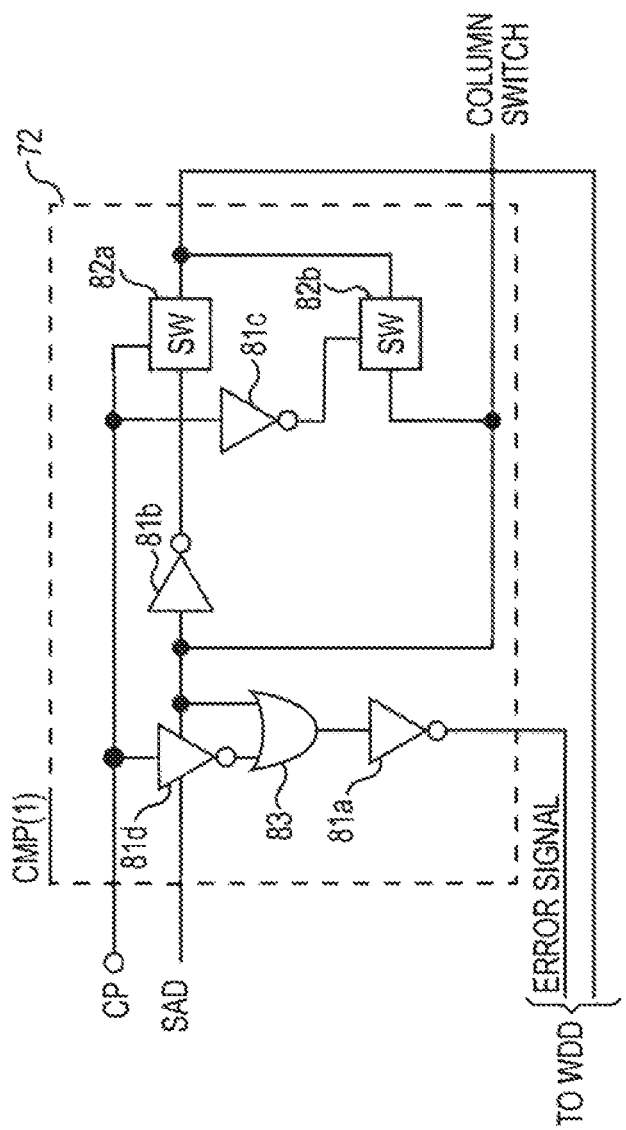
FIG. 15 is a view showing one example of a circuit configuration of a comparison circuit in accordance with a third embodiment.

FIG. 15 is a view showing one example of the circuit configuration of a comparison circuit 72 relating to a third embodiment. In FIG. 15, those constituent elements that are the same as those of FIG. 12 are indicated by the same reference numerals and the description thereof will be omitted.

In the comparison circuit 72 shown in FIG. 15, data "1" are preliminarily set. With respect to the comparison circuit with data "0" preliminarily set, since there are no different points from the circuit configuration that has been explained by reference to FIG. 14 in the second embodiment; therefore, the description thereof will be omitted.

The comparison circuit 72 shown in FIG. 15 is different from the comparison circuit 71 shown in FIG. 12 in that an inverter circuit 81d is further installed and in that a NOR circuit 83 is provided in place of the NAND circuit 80.

The NOR circuit 83 receives a signal obtained by inverting the compare mode setting signal CP in the inverter 81d in one of the inputs. The NOR circuit 83 receives a signal outputted by the data-bit-use sense amplifier 61a in the other input.

Normal Operation

Referring to FIG. 15, the following description will discuss operations of the comparison circuit 72 in the case when the compare mode setting signal CP is the L-level.

In the case when the compare mode setting signal CP is the L-level, the switch 82a is made non-conductive, while the switch 82b is made conductive. Therefore, readout data from the data-bit-use sense amplifier 61a are supplied to the column switch 70 are supplied to the column switch 70. Alternatively, writing data from the column switch 70 are supplied to the data-bit-use writing driver 65.

Additionally, since the compare mode setting signal CP is the L-level, the output of the NAND circuit 80 is the H-level irrespective of the output of the data-bit-use sense amplifier 61a, and the inversion signal (error signal) by the inverter circuit 81a becomes the L-level. Therefore, in the case of the L-level of the compare mode setting signal CP, no error signal is generated by the comparison circuit 71.

Comparing Operation

Referring to FIG. 15, the following description will discuss operations of the comparison circuit 72 in the case when the compare mode setting signal CP is the H-level.

In the case when the compare mode setting signal CP is the H-level, the switch 82a is made conductive, while the switch 82b is made non-conductive. Since the switch 82b is non-conductive, writing data from the column switch 70 are not supplied to the data-bit-use writing driver 65.

In FIG. 15, suppose that reference data of data "1" are read out from the data-bit-use sense amplifier 61a relative to the comparison circuit 72 with data "1" set therein.

In this case, since an inversion compare mode setting signal CP of the L-level and the output signal of the data-bit-use sense amplifier 61a of the H-level are inputted to the NOR circuit 83, the output of the inverter circuit 81a becomes the L-level. Therefore, in this case, an error signal is generated by the comparison circuit 72.

On the other hand, suppose that reference data with data "0" set therein are read out from the data-bit-use sense amplifier 61 relative to the comparison circuit 72 with data "1" set therein.

In this case, since the inversion compare mode setting signal CP of the L-level and the output signal of the data-bit-use sense amplifier 61a of the L-level are inputted to the NOR circuit 83, the output of the inverter circuit 81a becomes the H-level. Therefore, in this case, an error signal is generated by the comparison circuit 72.

Since the switch 82a is made conductive by the compare mode setting signal CP of the H-level, a signal (H-level signal) obtained by inverting readout data "0" from the data-bit-use sense amplifier 61a is supplied to the data-bit-use writing driver 65.

Since the error signal is the H-level, the data-bit-use writing driver 65 writes corrected data (in this case, data "1" supplied from the comparison circuit 72 in reference memory cells.

In the semiconductor device in accordance with the third embodiment also, the writing frequency onto reference memory cells is reduced in the same manner as in the first and second embodiments so that the reliability of the reference memory cells is improved.

Fourth Embodiment

In the semiconductor devices 1 explained in the first to third embodiments, it is not assumed that reference data (data "0", data "1") stored by the respective reference memory cells are altered. However, there are supposed to be some cases in which due to various factors, data to be stored by the respective reference memory cells are altered after the semiconductor device 1 has been manufactured.

For example, by making the number of reference memory cells for use in storing data "0" and the number of reference memory cells for use in storing data "1" equal to each other, the intermediate value between the signal value corresponding to data "0" and the signal value corresponding to data "1" is allowed to form a reference voltage or a reference current. However, the intermediate value is not necessarily an optimal value, and the reference signal is desirably altered after the testing process or the chip delivery of the semiconductor device 1. That is, a semiconductor device 1 in which the number of reference memory cells for use in storing data "0" and the number of reference memory cells for use in storing data "1" are variably set is desirably demanded.

A semiconductor device 1 relating to the fourth embodiment is provided with a comparison circuit 73 by which even when, after the manufacturing process of the semiconductor device 1, data stored in the respective reference memory cells are altered, the corresponding alteration is flexibly accepted.

Figure 16:
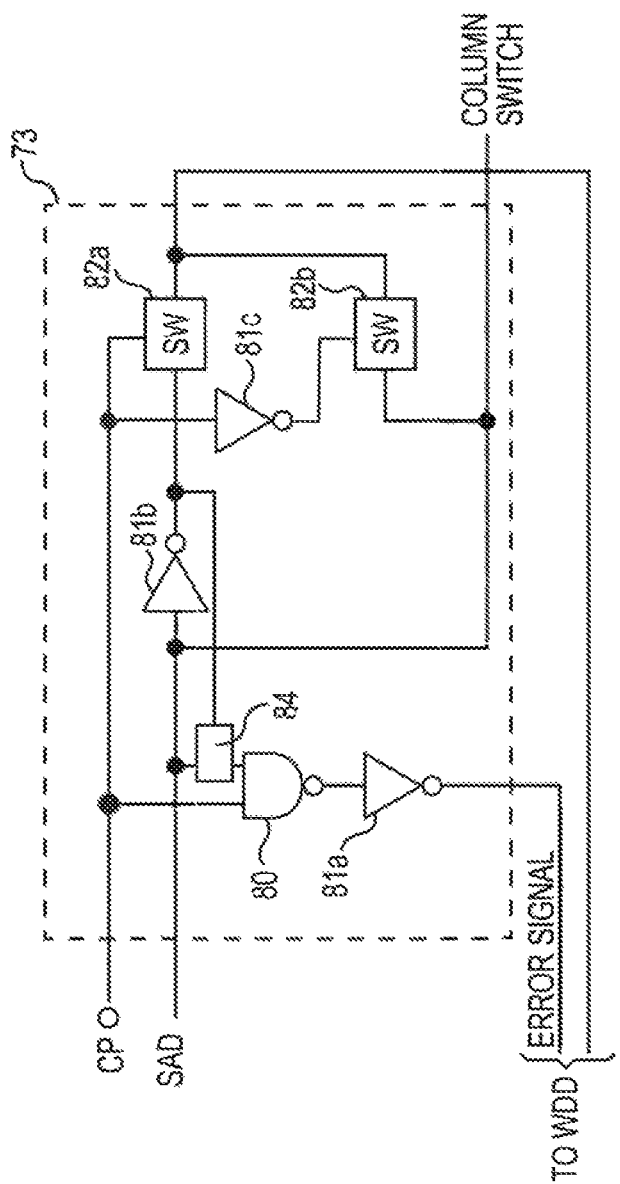
FIG. 16 is a view showing one example of a circuit configuration of a comparison circuit in accordance with a fourth embodiment.

FIG. 16 is a view showing one example of a circuit configuration of the comparison circuit 73 in accordance with the fourth embodiment. In FIG. 16, those constituent elements that are the same as those of FIG. 12 are indicated by the same reference numerals, and the description thereof will be omitted.

The comparison circuit 73 is provided with a selection circuit 84. The selection circuit 84 is a circuit with two inputs and one output. The input terminals of the selection circuit 84 are connected to the before and after the inverter circuit 81b. The output terminal of the selection circuit 84 is connected to the NAND circuit 80.

The selection circuit 84 is designed so as to be switchable as to which input terminal should be connected to the output terminal by using control lines, not shown.

Figure 17:
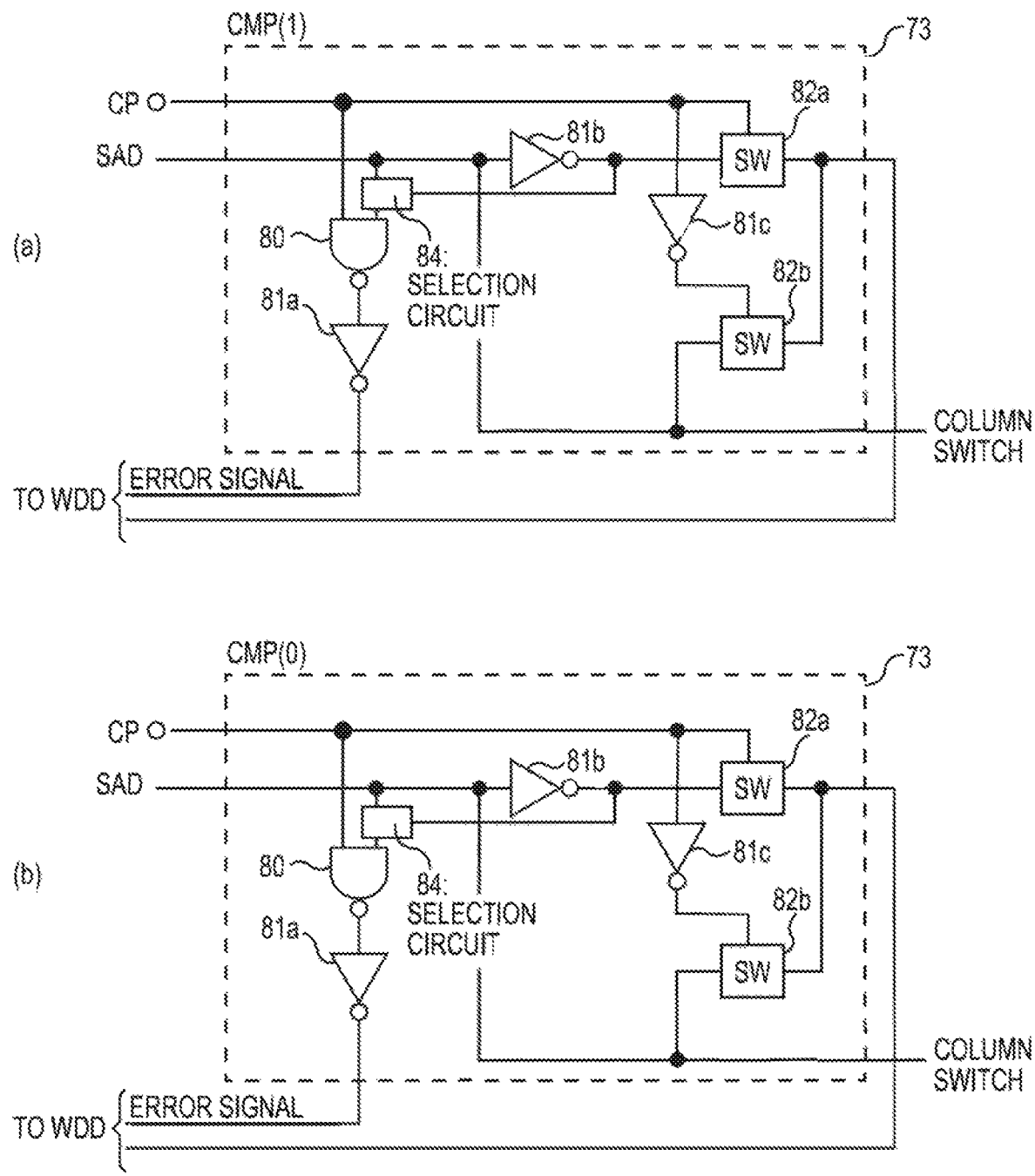
FIG. 17 is a view for use in explaining operations of a selection circuit.

In the case when the output signal of the inverter circuit 81b is supplied to the NAND circuit 80 by the selection circuit 84, a circuit configuration shown in FIG. 17(a) is prepared. On the other hand, in the case when the output signal of the data-bit-use sense amplifier 61a is supplied to the NAND circuit 80 by the selection circuit 84, a circuit configuration shown in FIG. 17(b) is prepared.

The circuit configuration shown in FIG. 17(a) is substantially equivalent to the comparison circuit 71 shown in FIG. 12. Therefore, the comparison circuit 73 shown in FIG. 17(a) is operated in the same manner as in the comparison circuit 71 shown in FIG. 12. Moreover, the comparison circuit 73 shown in FIG. 17(b) is substantially equivalent to the comparison circuit 71 shown in FIG. 14, and is operated in the same manner. For this reason, the explanation relating to operations of the comparison circuit 73 will be omitted.

The connection switching process of the selection circuit 84 is carried out by a chip control circuit 13. The chip control circuit 13 receives data to be set in the respective selection circuits 84 by a command or the like supplied from the outside, and switches the settings of the selection circuit 84 depending on the corresponding data. Alternatively, in the case when selection is made between two data patterns composed of reference data, that is, a pattern starting with 0, such as "0101 . . . ," and a pattern starting with 1, such as "1010 . . . ", the settings of the selection circuit 84 may be switched depending on a voltage of a port connected to an external apparatus.

The semiconductor device 1 in accordance with the fourth embodiment makes it possible to flexibly accept an alteration of data to be stored by the respective reference memory cells even after the production of the chip. Moreover, in the same manner as in the second embodiment, it is possible to reduce the writing frequency to the reference memory cells even in the case when no ECC function is provided, and consequently to improve the reliability of the reference memory cells.

Fifth Embodiment

In the semiconductor devices 1 explained in the first to fourth embodiments, the explanation has been given by exemplifying a configuration in which during normal reading/writing operations, or between the reading and writing operations, by reading and monitoring reference data (data "0", data "1") stored by the individual reference memory cells, the stored data of the corresponding reference memory cell are corrected when the stored data are different from an expected value.

It has been described earlier that in an STT-RAM, an inversion of stored data that singly occurs due to various reasons is observed, and in this case, since the probability of the observation of the inversion of repetitive stored data in the same memory cell is low, this phenomenon is referred to normally as "soft error". On the other hand, due to deterioration or the like of the storing layer of the memory cell, the inversion of stored data tends to be sometimes observed repetitively even if the correction of the stored data is carried out. Such a reference memory cell is referred to as a defective reference memory cell on demand.

Figure 18:
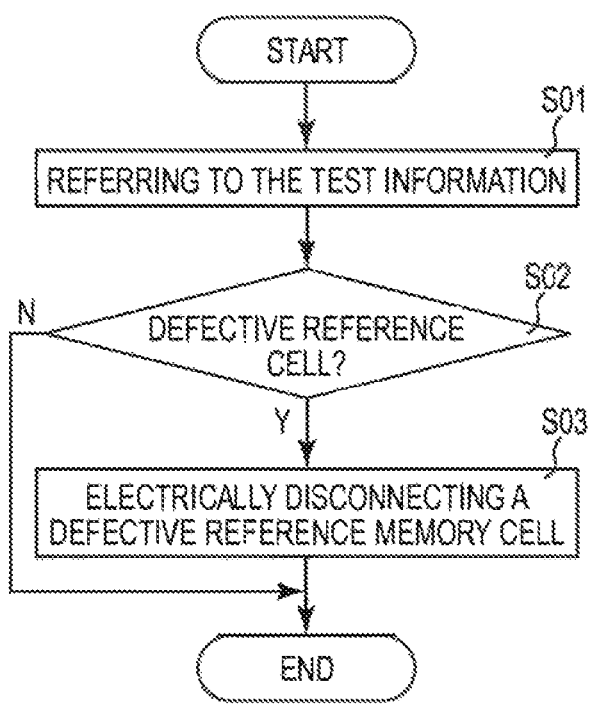
FIG. 18 is a flow chart showing one example of a control method for a semiconductor device in accordance with a fifth embodiment.

FIG. 18 is a flow chart showing one example of a control method for the semiconductor device in accordance with the fifth embodiment.

Referring to FIG. 18, the following description will discuss the outline of the fifth embodiment. Additionally, reference numerals for the drawings attached to the outline are denoted to the respective elements on demand as examples for use in aiding understanding thereof and the description of the outline is not intended to limit the present invention.

Figure 23:
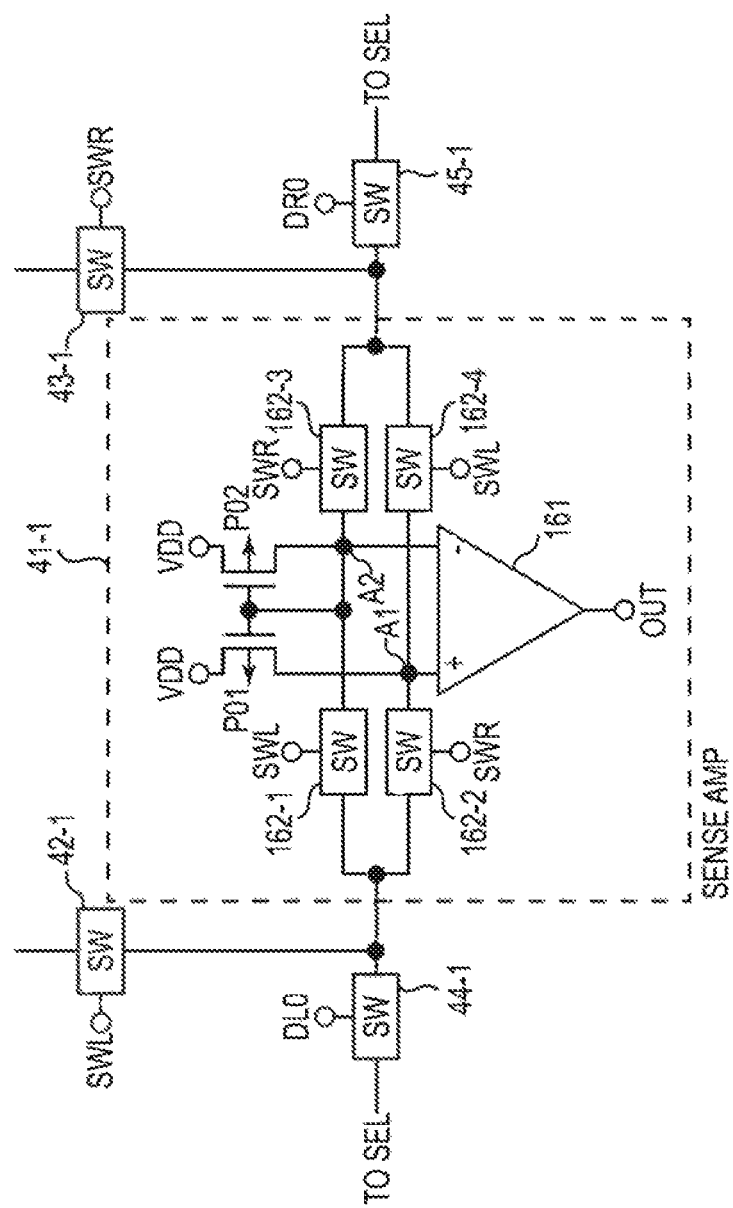
FIG. 23 is a view showing one example of a circuit configuration of the sense amplifier.
Figure 27:
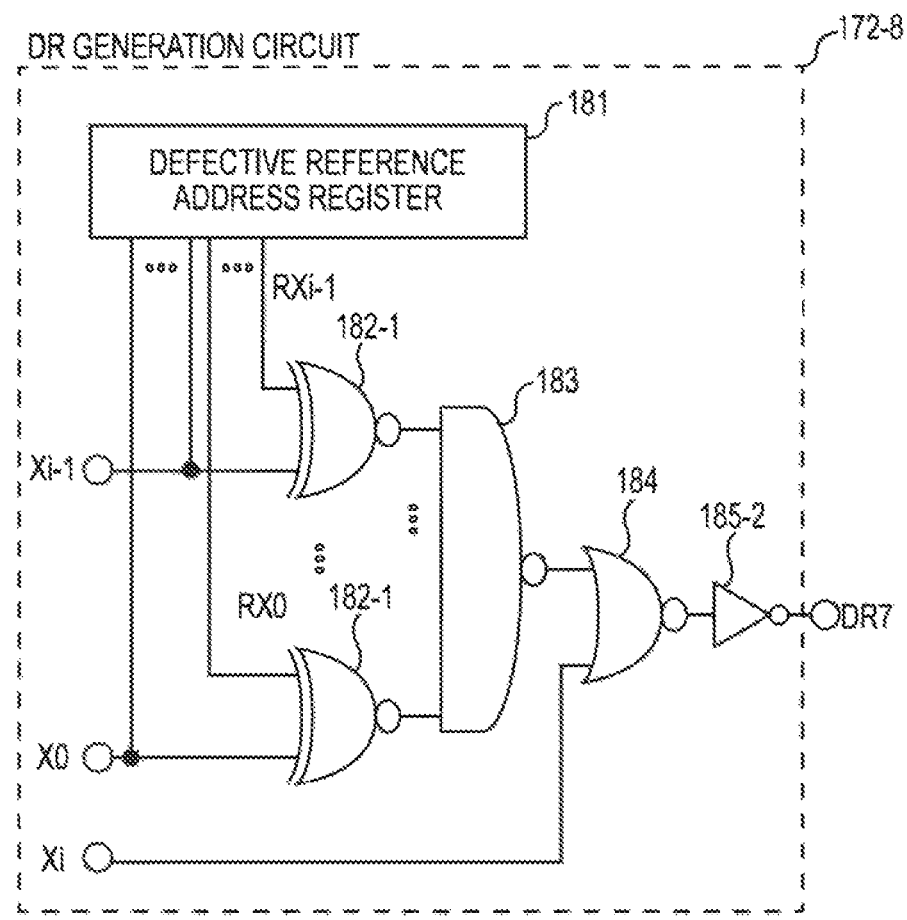
FIG. 27 is a view showing one example of a circuit configuration of a DR generation circuit.

The control method of the semiconductor device in accordance with the fifth embodiment is applied to a semiconductor device that is provided with a plurality of reference memory cells connected in parallel with one after another (for example, reference memory cells indicated by black circles in FIG. 23) and an address storage region (for example, defective reference address register 181 shown in FIG. 27) for storing test information concerning the plural reference memory cells. As shown in FIG. 18, the control method for the semiconductor device in accordance with the fifth embodiment includes a step of referring to the test information stored in the address storage region (step S01), and a step of electrically disconnecting a defective reference memory cell of the plural reference memory cells from the parallel connection without carrying out a redundancy replacement thereon in accordance with the test information (step S03).

In accordance with the above-mentioned control method, even when a defective reference memory cell is present, the defective reference memory cell is not saved by being replaced with a redundant bitline, but cut off from the parallel circuit of the reference memory cells. As will be described later, even when a small number of reference memory cells are cut off from the parallel connection, it is possible to sufficiently maintain a sense margin. Therefore, the control method for the semiconductor device in accordance with the fifth embodiment makes it possible to obtain an effect for improving the sense margin by arranging the reference memory cells in parallel with one another and also to avoid the increase of the chip area and the complexity of the saving circuit.

Figure 19:
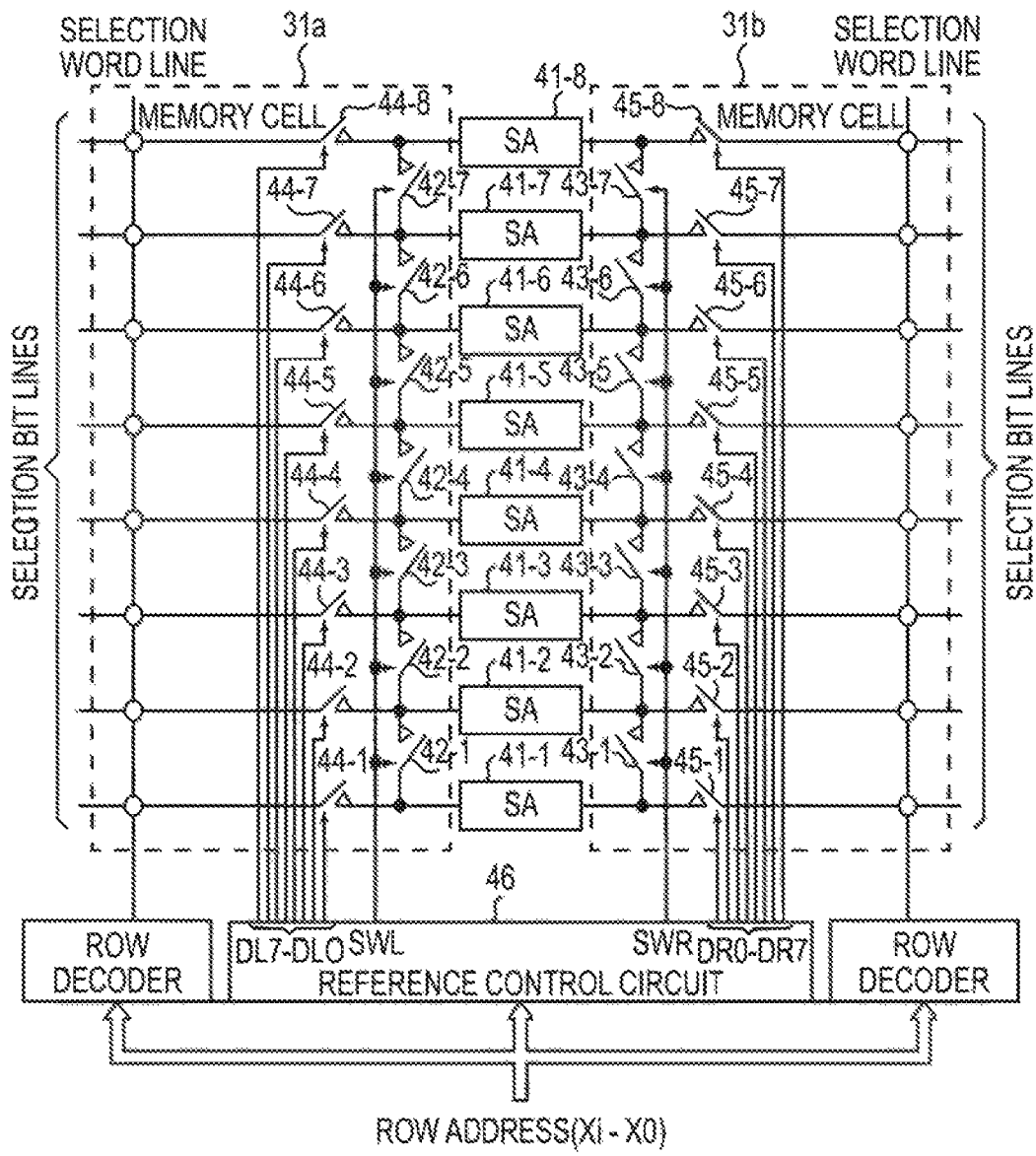
FIG. 19 is one example of a schematic view showing one portion of a control circuit for use in reading out data from the memory cell.

FIG. 19 shows one example of a schematic view showing one portion of a control circuit for use in reading out data from the memory cells. Those constituent elements that are the same as those of FIG. 4 are indicated by the same reference numerals, and the description thereof will be omitted. The point of difference lies in that switches 44-1 to 44-8, switches 45-1 to 45-8 and a reference control circuit 46 for generating connection control signals DL0 to DL7 and DR0 to DR7 are installed.

Each of the sense amplifiers 41 is a differential amplifier, and a selection bitline for extending a memory cell array 31a on the left side is connected to one of differential input terminals, with the switch 44 interposed therebetween.

Moreover, to the other differential input terminal of the sense amplifier 41, a selection bitline for extending a memory cell array 31b on the right side is connected, with the switch 45 interposed therebetween.

The switch 44 is made conductive or non-conductive by the connection control signals DL7 to DL0. The switch 44 becomes conductive in the case of the H-level of the corresponding connection control signal DL7 to DL0.

The switch 45 is made conductive or non-conductive by the connection control signals DR7 to DR0. The switch 45 becomes conductive in the case of the H-level of the corresponding connection control signal DR.

The switch 42 is connected between the differential input terminals connected to the selection bitline for extending the memory cell array 31a on the left side, which correspond to the differential input terminals of adjacent sense amplifiers 41.

Each of the switches 42 is controlled in its conductive and non-conductive states. The switch 42 becomes conductive when the reference control signal SWL is in the H-level.

In the same manner, the switch 43 is also connected between the differential input terminals connected to the selection bitline for extending the memory cell array 31b on the right side, which correspond to the differential input terminals of adjacent sense amplifiers 41. The switch 43 becomes conductive when the reference control signal SWR is in the H-level.

Upon reading out user data from the memory cell array 31a on the left side, the reference control circuit 46 controls the connection control signal SWL to the L-level, the connection control signal SWR to the H-level, the connection control signals DL7 to DL0 to the H-level and the connection control signals DR7 to DR0 to the H-level, respectively.

For example, in the case when there is a defect in a reference memory cell included in the memory cell array 31b on the right side, the reference control circuit 46 controls one portion of the connection control signals DR7 to DR0 to the L-level in accordance with the position of the corresponding defective reference memory cell.

Additionally, upon reading out user data from the memory cell array 31b on the right side, the reference control circuit 46 controls the connection control signals DL7 to DL0 to the H-level, the connection control signals DR7 to DR0 to the H-level, the connection control signal SWL to the H-level, and the connection control signal SWR to the L-level, in principle, respectively.

Additionally, in FIGS. 19 to 23, it is supposed that white circles located at intersections between the bitlines and the word lines indicate normal cells, black circles located at the intersections indicate reference memory cells, and those black circles in combination with x indicate defective reference memory cells.

Figure 20:
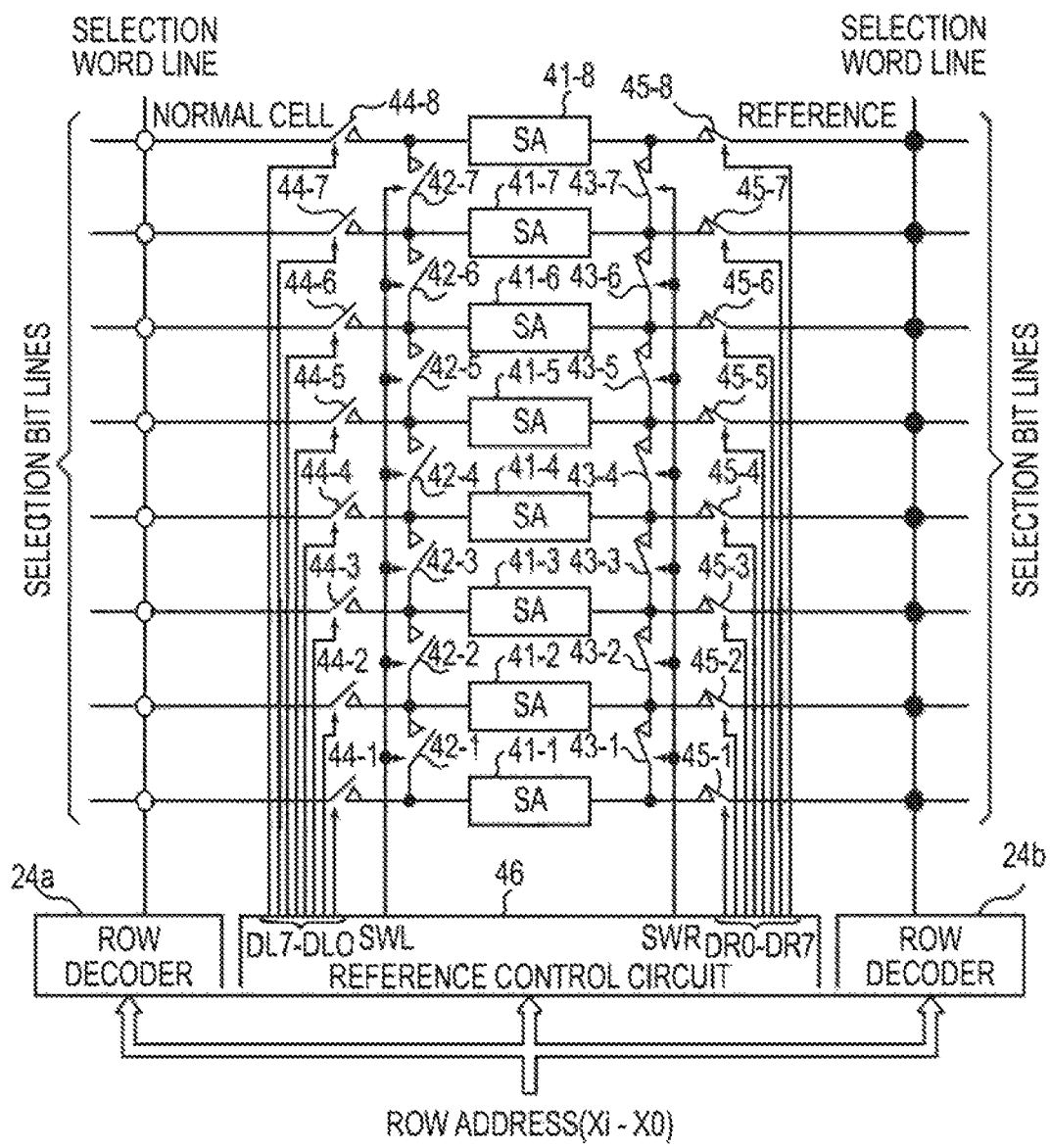
FIG. 20 is a view for use in explaining a reading operation from a normal cell in the case when no defective reference cell exists.

FIG. 20 is a view for use in explaining a reading operation of user data to be stored in the normal cells on the left side by using the reference cells on the right side. In particular, FIG. 20 shows a state in which no defects are included in the 8 reference memory cells on the right side.

The user data stored in the normal cells on the left side are accessed by allowing the reference control circuit 46 to control the connection control signals DL7 to DL0 to the H-level and the connection control signal SWL to the L-level. Moreover, the reference data stored in the 8 reference memory cells on the right side can be accessed by allowing the reference control circuit 46 to control the connection control signals DR7 to DR0 to the H-level and the connection control signal SWR to the H-level.

By using these connection control signals, all the switch 43, switch 44 and switch 45 are made conductive, with all the switches 42 being made non-conductive. In response to these switching operations, the input terminal of each of the sense amplifiers 41 on the left side is connected to a normal cell, with the input terminal on the right side being corrected in parallel with the 8 reference cells. By using a reference signal (reference voltage or reference current) generated by the reference memory cell on the right side, the sense amplifier 41 sense-amplifies a signal voltage outputted from the normal cell on the left side, and outputs the resulting signal voltage as user data.

Figure 21:
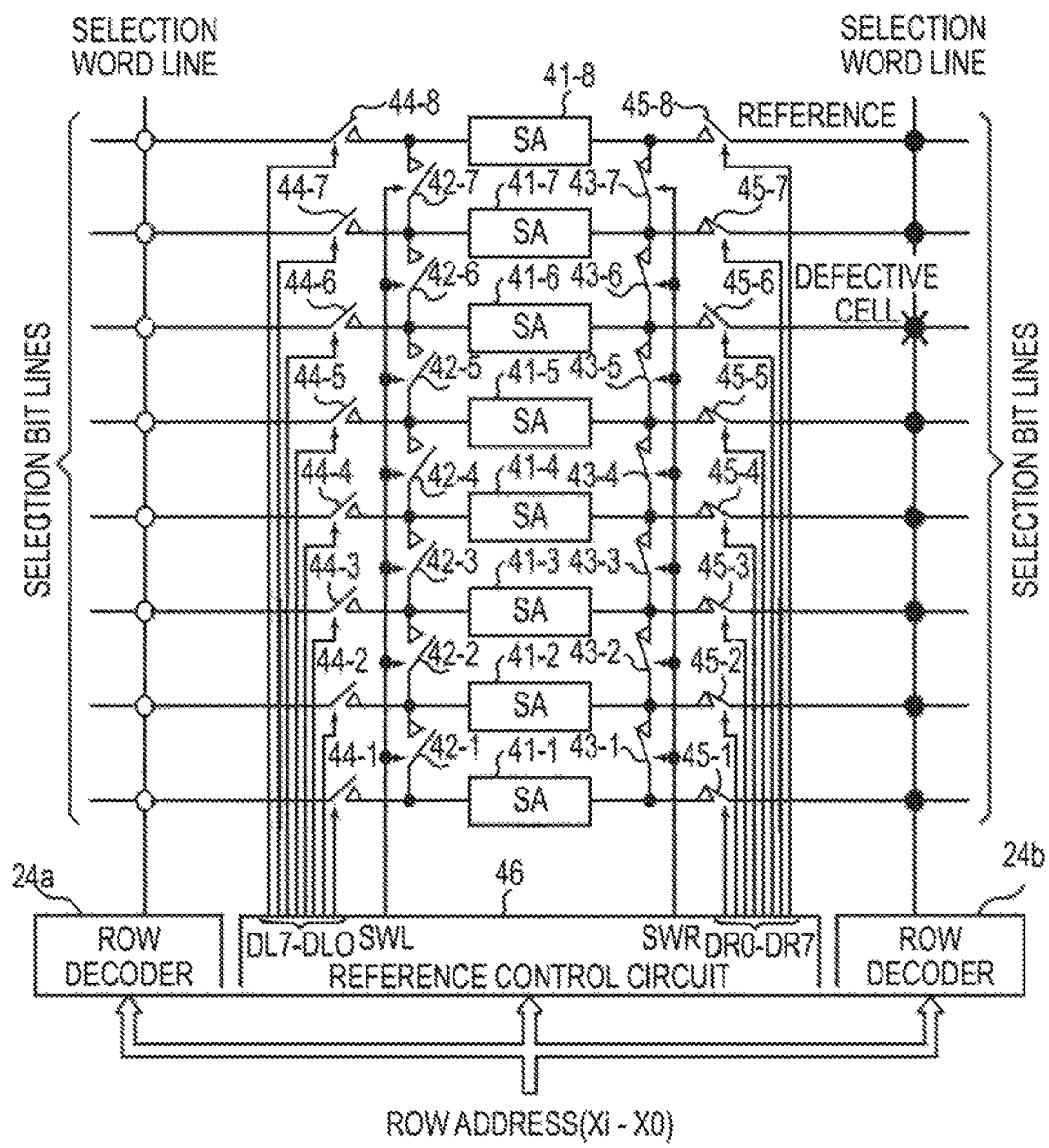
FIG. 21 is a view for use in explaining a reading operation from a normal cell in the case when one defective reference cell exists.

FIG. 21 is a view for use in explaining reading operations of the user data stored in the normal cell on the left side by using reference cells on the right side. In particular, FIG. 21 shows a state in which one defective reference cell (the third one from above) is present among the 8 reference cells on the right side.

In order to read out the user data from the normal cell on the left side, the connection control signals DL7 to DL0 are controlled to the H-level and the connection control signal SWL is controlled to the L-level. Moreover, since the reference memory cells on the light side are used, the connection control signal SWL is controlled to the H-level.

Since the reference memory cells on the right side are used, all the connection control signals DR7 to DR0 are controlled to the H-level in the case when no defects are included in the 8 reference cells on the right side, as shown by an example of FIG. 20.

Here, in the case when only the third reference cell from above is a defective reference memory cell as shown by the example shown in FIG. 21, the connection control signals DR7, DR6, and DR4 to DR0 are controlled to the H-level, while the control signal DR5 is controlled to the L-level.

In the example shown in FIG. 21, as a result of the controlling operations of the connection control signals DR7 to DR0, among the switches 45-1 to 45-8, the other switches except for the switch 45-6 are made conductive, with the switch 45-6 being made non-conductive. Therefore, the third defective reference memory cell from above is separated from the parallel arrangement, and a reference signal is generated by using the remaining 7 reference memory cells.

Additionally, although its detailed description will be given later, information relating to the defective reference memory cell is stored in the DL generation circuit and the DR generation circuit inside the reference control circuit 46. The information relating to the defective reference memory cell stored in these circuits includes at least a row address indicating the position of the defective reference memory cell.

Based upon the address of the defective reference memory cell stored therein, the reference control circuit 46 detects a switch that deviates from the principle of the switching control in the switch 44 and the switch 45, and controls the corresponding connection control signals DL and DR to the L-level. Therefore, even when the position of the defective reference memory cell is different, the connection control signals DL and DR can be controlled in the same manner as described above.

Figure 22:
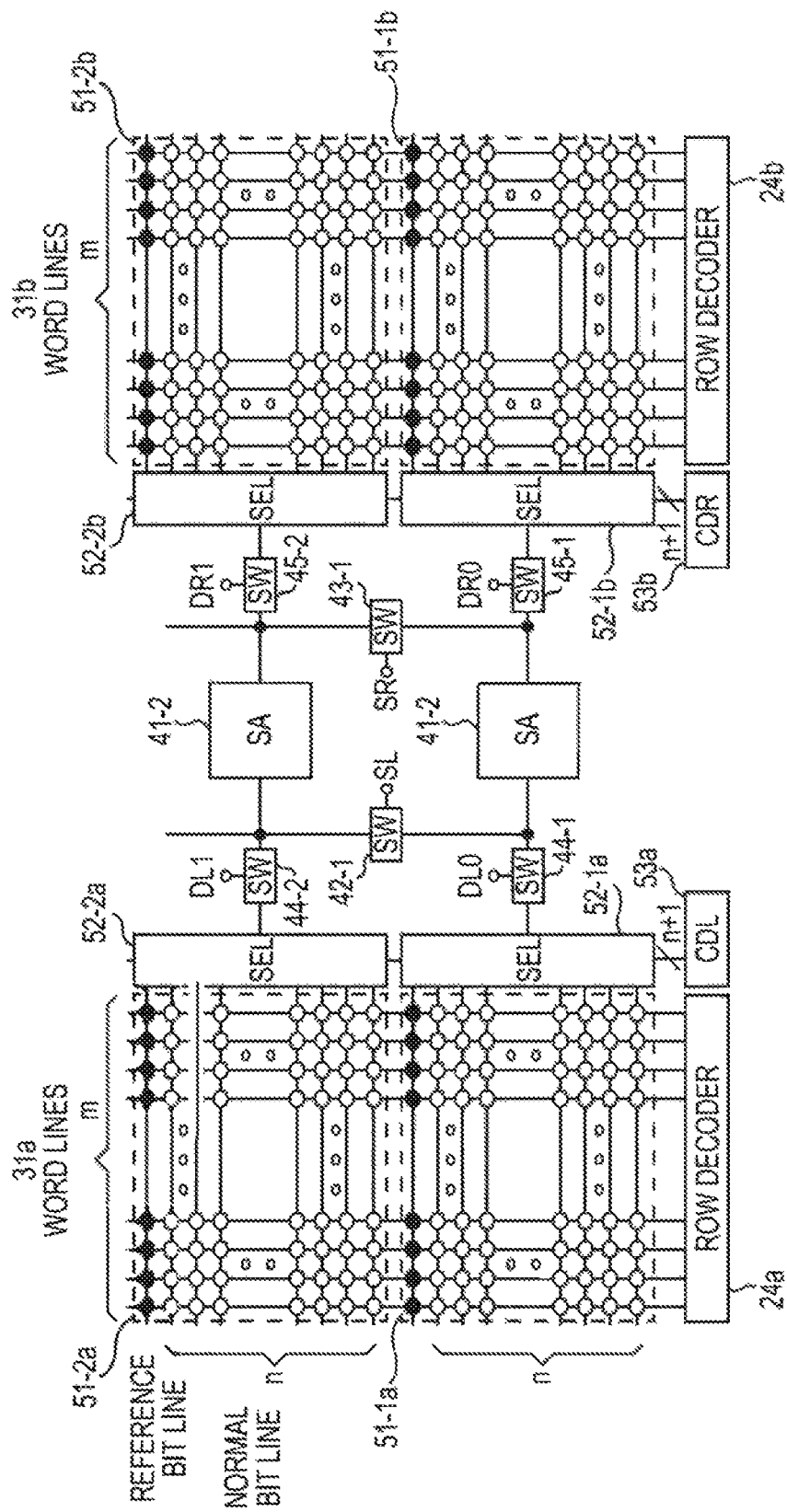
FIG. 22 is a view that schematically shows one example of a control circuit relating to the sense amplifier.

FIG. 22 is a view that schematically shows one example of a control circuit relating to the sense amplifiers 41-1 and 41-2 shown in FIG. 19.

The memory cell array is constituted by a plurality of memory mats. More specifically, the memory array is constituted by using a memory mat in which m×(n+1) number of memory cells are arranged in a matrix form as one unit. Additionally, both of m and n are positive integers, and the same is true for the following explanation.

FIG. 22 illustrates memory mats 51-1a and 51-2a serving as one portion of the memory cell array 31a and memory mats 51-1b and 51-2b serving as one portion of the memory cell array 31b.

Each memory mat 51 includes normal cells for staring user data and reference cells. More specifically, each memory mat 51 includes n×m number of normal cells and in number of reference memory cells.

In order to access to a memory cell included in each memory mat 51, in number of word lines and n+1 number of bitlines are used.

Among the n+1 number of bitlines, n number of bitlines are used as normal bitlines for accessing to normal cells. Among the n+1 number of bitlines, one bitline is used as a reference bitline for use in accessing to a reference memory cell.

Selectors (SEL) 52-1a, 52-1b, 52-2a, 52-2b are disposed for each memory mat 51. Each selector 52 selects one bitline from the n+1 number of bitlines for extending each memory mat 51, and connects this to a sense amplifier.

A selector control circuit (CDL) 53a is a circuit for controlling the selection operation of the bitlines by the selector 52-1a, 52-2a or the like on the left side.

The selector control circuit 53a inputs the most significant row address of the column addresses and row addresses. Additionally, the most significant row address refers to the most significant address among i+1 number of row addresses Xi to X0 for use in selecting 2 m number of word lines.

In the case when normal cells included in the memory cell array 31a on the left side serve as accessing targets, the row address Xi is set to the L-level. On the other hand, in the case when normal cells included in the memory cell array 31b on the right side serve as accessing targets, the row address Xi is set to the H-level.

The selector control circuit 53a is configured to select one of the normal bits from n number of normal bitlines based upon a column address when the row address Xi is set to the L-level. The selector control circuit 53a selects one of reference bitlines based upon the row address Xi.

The selector control circuit 53a is configured such that in the case when the row address Xi is set to the L-level, it selects one normal bitline from n number of normal bitlines, based upon the column address.

On the other hand, the selector control circuit 53a is configured such that in the case when the row address Xi is set to the H-level, it selects one reference bitline irrespective of the column address.

Based upon the column address and the row address Xi, the selector control circuit 53a selects one bitline from the n+1 number of bitlines (normal bitlines, reference bitlines).

The selector control circuit (CDR) 53b is also provided with the same function as the selector control circuit 53a.

The selector control circuit 53b is configured such that in the case when the row address Xi is set to the H-level, it selects one reference bitline from the n number of normal bitlines based upon the column address.

On the other hand, the selector control circuit 53b is configured such mat in the case when the row address Xi is set to the L-level, it selects one reference bitline irrespective of the column address.

Column addresses to be inputted to the selector control circuits 53a and 53b are desirably inputted at the same timing as the row address even in the case of an address multiplexer type memory chip.

Additionally, in the first embodiment, explanations have been given by exemplifying a configuration in which the selector control circuit 53 selects a bitline based upon the column address; however, the address to be used by the selector control circuit 53 is not intended to be limited by the column address, in the case when the row address is allowed to include address information for use in selecting one normal bitline from the n number of bitlines. the selector control circuit 53 controls the respective selectors based upon the row address.

The row decoder 24a selects one word line from in number of word lines for extending the memory mats 51-1a, 51-2a and the like on the left side, based upon the row addresses Xi to X0.

In the same manner, the row decoder 24b selects one word line from in number of word lines for extending the memory mats 51-1b and 51-2b on the right side, based upon the row addresses Xi to X0.

Additionally, although not illustrated in FIG. 22, the connection control signals SWL and SWR are also supplied to the sense amplifier 41.

FIG. 23 is a view showing one example of a circuit configuration of the sense amplifier 41. Additionally, since the circuit configurations of the sense amplifiers 41-1 to 41-8 are the same, FIG. 23 only shows the circuit configuration of the sense amplifier 41-1.

The sense amplifier 41 is configured to include a differential amplifier 161, four switches 162-1 to 162-4 and two P-channel-type MOS transistors P01 and P02.

The sources of the P-channel-type MOS transistors P01 and P02 are connected to a power supply VDD. The gates are commonly connected to the drain of the P-channel-type MOS transistor P02. The drain of the P-channel-type MOS transistor P01 is connected to a non-inversion input terminal of the drain differential amplifier 161. The drain of the P-channel-type MOS transistor P02 is connected to an inversion input terminal of the drain differential amplifier 161.

One end of each of the switches 162-1 and 162-2 is commonly connected to the switch 44-1 and the switch 42-1. The other end of the switch 162-1 is connected to the gates of the P-channel-type MOS transistors P01 and P02, the drain of P02, an inversion input terminal of the differential amplifier 161 and one end of the switch 162-3. The other end of the switch 162-2 is connected to a non-inversion input terminal of the differential amplifier 161 and one end of the switch 162-4.

One end of each of the switches 162-3 and 162-4 is commonly connected to the switch 45-1 and the switch 43-1. The other end of the switch 162-3 is connected to the gates of the P-channel-type MOS transistors P01 and P02, the drain of P02, an inversion input terminal of the differential amplifier 161 and one end of the switch 162-1. The other end of the switch 162-4 is connected to a non-inversion input terminal of the differential amplifier 161 and one end of the switch 162-2.

The switches 162-1 and 162-4 are controlled n their conductive and non-conductive states by the connection control signal SWL. The switches 162-2 and 162-3 are controlled in their conductive and non-conductive states by the connection control signal SWR.

Figure 24:
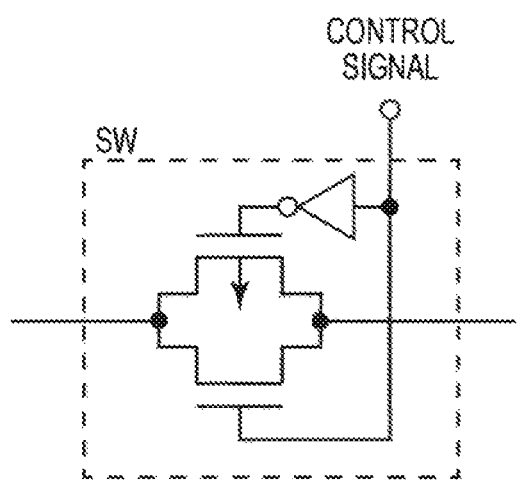
FIG. 24 is a view showing one example of a circuit configuration of the switch.

Additionally, as the switches 42 to 45 and switch 162, the transfer gate (see FIG. 24) constituted by a PMOS transistor and an NMOS transistor may be used.

Next, the following description will discuss operations of the sense amplifier 41 in the case when data are read out from normal cells included in the memory cell array 31a on the left side.

Upon reading out data from a normal cell included in the memory cell array 31a on the left side, the connection control signal DL is controlled to the H-level. the connection control signal SWL is controlled to the L-level and the connection control signal SWR is controlled to the H-level. Moreover, the connection control signal DR is controlled to the H-level in principle, in the case when the corresponding reference memory cell is not defective.

As a result of the controlling operation relating to the above-mentioned connection control signal, a normal cell is connected to the non-inversion input terminal of the differential amplifier 161 through the switch 44-1 and the switch 162-2. Moreover, to the inversion input terminal of the differential amplifier 161, reference memory cells connected in parallel with each other are connected, through the switches 45-1, 43-1 and 162-3.

A current that is allowed to flow through a reference memory cell whose resistance value is set to the intermediate value between the resistance value used for defining data "1" and the resistance value used for defining data "0" is generated as a reference current. Since a current mirror circuit is formed by the P-channel-type MOS transistors P01 and P02, the reference current is duplicated and allowed to flow through the normal cell. As a result, in accordance with the resistance value of the normal cell, the electric potential of the node A1 (non-inversion input terminal of the differential amplifier 161) is changed so that a potential difference relative to the node A2 (inversion input terminal of the differential amplifier 161) is amplified by the differential amplifier 161, and outputted as readout data.

Upon reading out data from a normal cell induced in the memory cell array 31b on the right side, the sense amplifier 41 carries out operations in a manner so as to switch the right and left sides.

Figure 25:
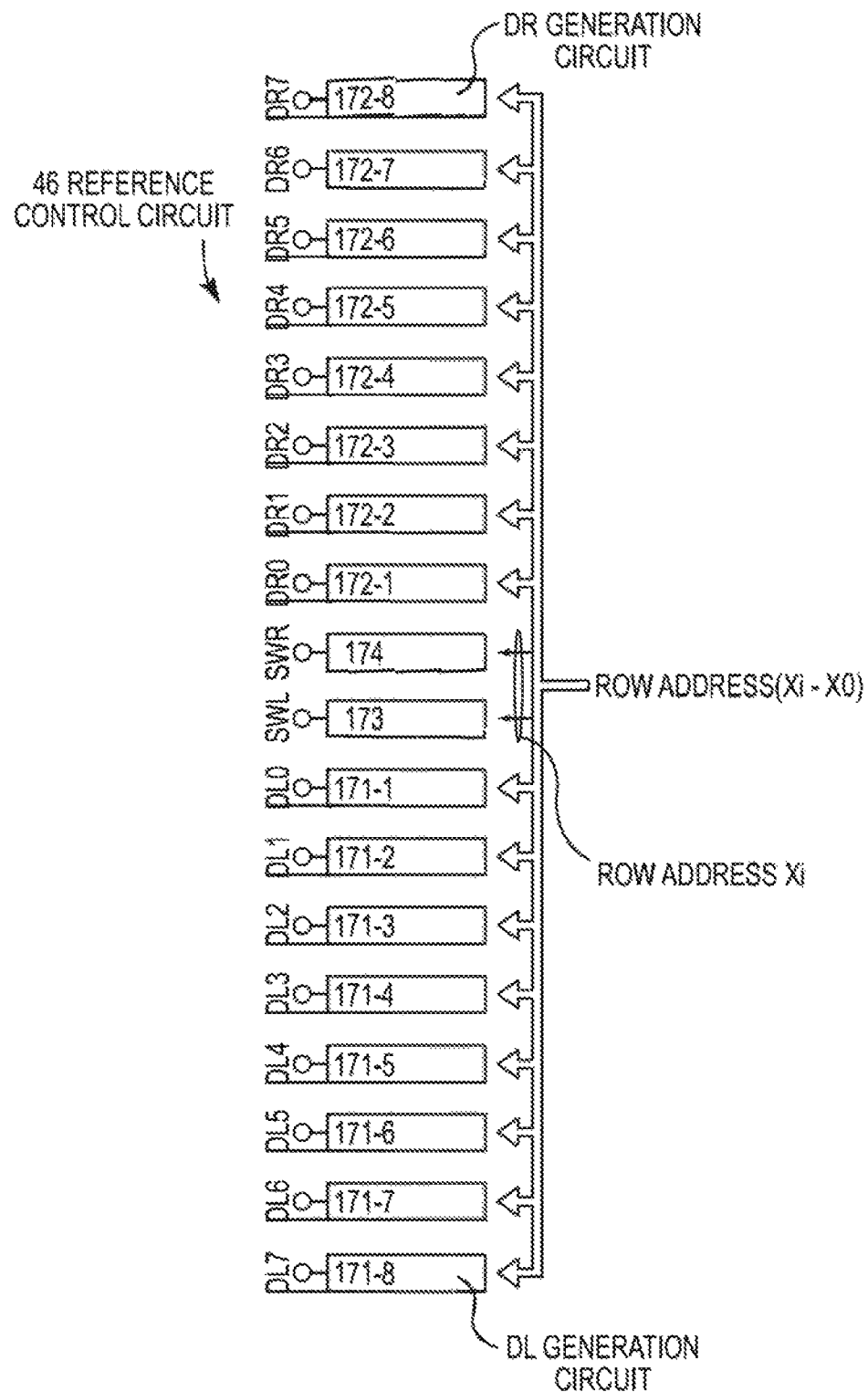
FIG. 25 is a view showing one example of a circuit configuration of the reference control circuit.

FIG. 25 is a view showing one example of a circuit configuration of the reference control circuit 46.

The reference control circuit 46 is a circuit for use in generating the connection control signals DL7 to DL0, DR7 to DR0, as well as SWL and SWR, based upon the row address.

The reference control circuit 46 is configured to include DL generation circuits 171-1 to 171-8 for respectively generating the connection control signals DL0 to DL, DR generation circuits 172-1 to 172-8 for respectively generating the connection control signals DR0 to DR7, an SWL generation circuit 173 for generating the connection control signal SWL and an SWR generation circuit 174 for generating the connection control signal SWR.

The DL generation circuit 171 and the DR generation circuit 172 respectively generate the connection control signals DL and DR based upon row addresses Xi to X0. The SWL generation circuit 173 and the SWR generation circuit 174 respectively generate the connection control signals SWL and SWR based upon the row address Xi.

Figure 26:
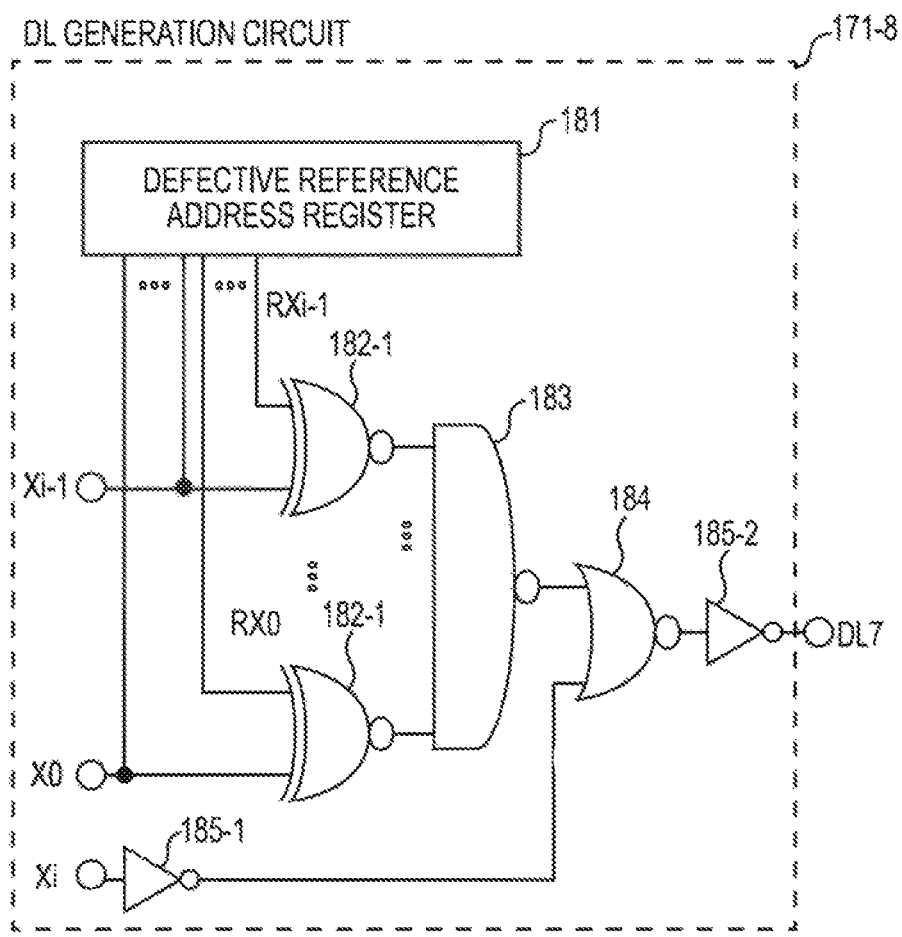
FIG. 26 is a view showing one example of a circuit configuration of a DL generation circuit.

FIG. 26 is a view showing one example of a circuit configuration of the DL generation circuit 171-8. Since the DL generation circuits 171-1 to 171-8 respectively have the same circuit configuration, the explanation relating to the DL generation circuits 171-1 to 171-7 will be omitted.

The DL generation circuit 171-6 includes a defective reference address register 181, i number of exclusive NOR circuits 182-1 to 182-i, a NAND circuit 183, a NOR circuit 184 and two inverter circuits 185-1 and 185-2.

The defective reference address register 181 is a storing region configured by including storing elements, such as a fuse, an anti-fuse, a register arid the like, and in the case when a defective reference cell is present on a reference bitline. the region functions as a means for storing the row address of the corresponding defective reference memory cell. Additionally, in the following explanation, the row address of the defective reference cell is denoted as defective address RXi-1 to RX0.

The defective addresses RXi-1 to RX0 to be registered in the defective reference address register 181 are confirmed by a testing process or the like of the semiconductor device 1. The defective addresses RXi-1 to RX0 thus confirmed are inputted by a test mode or the like installed in the semiconductor device 1, and based upon an instruction by the chip control circuit, the corresponding inputted row addresses Xi-1 to X0 are stored. The defective reference address register 181 functions as a means (address storing region) for storing test information relating to the defective reference memory cells that are diagnosed as defective among the reference memory cells. The defective reference address register 181 outputs the registered defective addresses RXi-1 to RX0 at the time of a normal operation of the semiconductor device 1.

Each of the outputted defective addresses RXi-1 to RX0 is inputted to one of input terminals of the corresponding one of i number of exclusive NOR circuits 182. Each of the row addresses Xi-1 to X0 is inputted to the other input terminal of the exclusive NOR circuit 182.

The respective outputs of the exclusive NOR circuits 182 are inputted to the NAND circuit 183. The output of the NAND circuit 183 is inputted to one of the input terminals of the NOR circuit 184.

To the other input terminal of the NOR circuit 184, the row address Xi inverted by the inverter circuit 185-1 is inputted. The output of the NOR circuit 184 is inverted by the inverter circuit 185-2, and outputted as a connection control signal DL7.

Each of the exclusive NOR circuits 182 compares the row address with a defective address outputted from the defective reference address register 181, and determines whether or not the two addresses are coincident with each other. That is, the exclusive NOR circuit 182 is operated as an address comparison circuit for comparing the row addresses Xi-1 to X0 with the preliminarily registered defective addresses RXi-1 to RX0.

In the case when the row address Xi-1 to X0 and the defective address RXi-1 to RX are coincident with each other, the exclusive NOR circuit 182 outputs a signal of the H-level. In the case when the two addresses are not coincident with each other, the exclusive NOR circuit 182 outputs a signal of the L-level.

In the case when all the exclusive NOR circuits 182 output signals of the H-level, the NAND circuit 183 outputs a signal of the L-level. In the case when all the row addresses Xi-1 to X0 and the defective addresses RXi-1 to RX0 are coincident with each other, the NAND circuit 183 outputs a signal of the L-level. On the other hand, in the case when the row addresses RXi-1 to X0 and the defective addresses RXi-1 to RX0 are different from each other even by a 1 bit, the NAND circuit 183 outputs a signal of the H-level. Additionally, although not illustrated in the FIGS., in the case when no defective reference memory cell is present the output of the NAND circuit 183 is forcefully controlled to the H-level by a control signal for use in making the defective reference address register 131 inactive.

In this case, in the case when a memory cell on the left side is selected as an accessing target, the row address Xi is set to the L-level. Therefore, the row address Xi of the L-level is inverted by the inverter circuit 185-1, and the signal of the H-level is inputted to one of the input terminals of the NOR circuit 184. In this case, the output of the NOR circuit 184 is set to the L-level irrespective of the output signal of the NAND circuit 183. As a result, the output signal of the NOR circuit 184 is inverted by the inverter circuit 185-2 so that the connection control signal DL7 is controlled to the H-level.

On the other hand, in the case when a memory cell on the right side is selected as an accessing target, since the row address Xi is in the H-level, a signal of the L-level is inputted to one of the input terminals of the NOR circuit 184. Therefore, the output signal of the NOR circuit 184 is changed depending on the output signal of the NAND circuit 183.

In the case when all the row addresses Xi-1 to X0 and the defective addresses RXi-1 to RX0 are coincident with each other, since the output signal of the NAND circuit 183 becomes the L-level, the output signal of the NOR circuit 184 becomes the H-level. In this case, the connection control signal DL7 is controlled to the L-level.

On the other hand, in the case when the row addresses Xi-1 to X0 and the defective addresses RXi-1 to RX0 are different from each other even by a 1 bit, since the output signal of the NAND circuit 183 becomes the H-level, the output signal of the NOR circuit 184 becomes the L-level. In this case, the connection control signal DL7 is controlled to the H-level.

As described above, in the case when the inputted row addresses Xi-1 to X0 are coincident with the defective addresses RXi-1 to RX0 registered in the detective reference address register 181, the DL generation circuit 171-8 controls the connection control signal DL7 to the L-level.

In the same manner, in the case when the defective addresses registered in the defective reference address register 181 and inputted row addresses are coincident with each other, each of the other DL generation circuits 171-1 to 171-7 also controls the corresponding connection control signal DL to the L-level.

FIG. 27 is a view showing one example of a circuit configuration of the DR generation circuit 172-8.

Additionally, since the DR generation circuits 172-1 to 172-8 respectively have the same circuit configuration, the description relating to the generation circuits 172-1 to 172-7 will be omitted.

The circuit configuration of the DR generation circuit 172-8 is the same as the circuit configuration of the DR generation circuit 171-8 except that no inverter circuit 185-1 is installed therein. Since no inverter circuit 185-1 is present in the DR generation circuit 172-8, the relationship between the row address Xi and the connection control signal DR7 is reversed to that of the DL generation circuit 171-8.

More specifically, in the case when the row address Xi is in the H-level, the connection control signal DR7 is controlled to the H-level. Moreover, when the row address Xi is in the L-level, with the row address and the detective address being coincident with each other, the connection control signal DR7 is controlled to the L-level. When the row address Xi is in the L-level, with the row address and the defective address being not coincident with each other, the connection control signal DR7 is controlled to the H-level.

Figure 28:
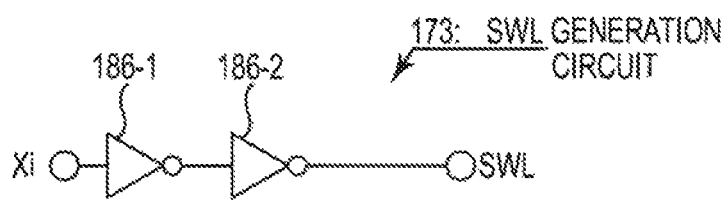
FIG. 28 is a view showing one example of a circuit configuration of a SL generation circuit.

FIG. 28 is a view showing one example of the SWL generation circuit 173. The SWL generation circuit 173 is constituted by two inverter circuits 186-1 and 186-2, and generates a signal having the same logical level as the row address Xi as the connection control signal SWL.

Figure 29:
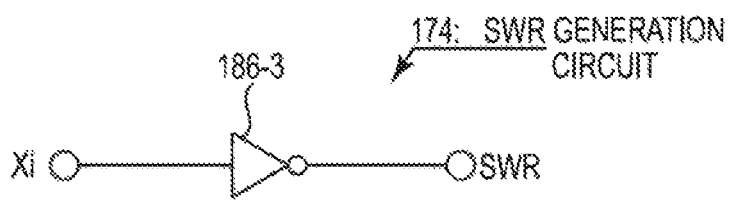
FIG. 29 is a view showing one example of a circuit configuration of a SR generation circuit.

FIG. 29 is a view showing one example of the SWR generation circuit 174. The SWR generation circuit 174 is constituted by an inverter circuit 186-3, and generates an inversion signal to the row address Xi as the connection control signal SWR.

By using the circuit configurations shown in FIGS. 25 to 29, the reference control circuit 46 realizes controls of the switches 42 to 45 explained by reference to FIGS. 20 to 22.

Returning back to FIG. 18, the control method of the semiconductor device 1 relating to the fifth embodiment is explained by reference to a flow chart shown in FIG. 18.

In step S01, a defective address (test information) registered in the defective reference address register 181 is referenced.

In step S02, it is determined whether or not any defective reference memory cell is present in reference memory cells that are connected in parallel with each other.

More specifically, in the case when a row address supplied from the outside and the defective address are coincident with each other, it is determined that any defective reference memory cell is present (step S02, YES branch), and a process relating to step S03 is executed.

On the other hand, in the case when the row address and the defective address are not coincident with each other, it is determined that no defective reference cell exists (step S02, NO branch), and the process is terminated.

In step S03, the connection control signals DL and DR corresponding to the bitline connected to the defective reference cell are controlled, and the defective reference memory cell is controlled to be electrically disconnected (excluded from the parallel connection) from the parallel connection, without carrying out a redundancy replacement thereon.

Additionally, the configuration and operations of the semiconductor device 1 explained in the fifth embodiment are exemplary only, and various modifications may be made therein.

For example, the defective address is not stored in the defective reference address register 181, but information indicating a good/defective state (for example, flag information) is registered therein as test information with respect to each of the reference memory cells, and based upon the corresponding test information, the defective reference memory cell may be excluded from the parallel arrangement.

Moreover, it is considered that two or more defective reference memory cells are present on a reference bitline. In order to deal with such a case, a configuration may be used in which a plurality of address comparison circuits are prepared and the logical OR of the output signal of each of the circuits may be used as the connection signal DL or DR.

Furthermore, it is considered that a large number of defective reference memory cells are sometimes present on the reference bitline. In order to deal with such a case, a register for use in recognizing the corresponding reference bitline itself as a defective bitline is installed, and in the case when a defective bitline is registered as the defective bitline in the register, the connection control signals DL and DR may be controlled to the L-level irrespective of the result of the address comparison.

It is also considered that two or more defective reference cells are sometimes present on the same word line. In order to deal with such a case, the number of reference cells to be arranged in parallel with one another may be preliminarily set to a sufficiently large number. In the case when two or more defective reference cells are present, these plural defective reference memory cells are excluded from the parallel arrangement to cause a reduction of the sense margin; however, by setting the initial value of the reference cells to be arranged in parallel with one another to a sufficiently large value, even when the defective reference memory cells are excluded from the parallel arrangement, the resulting influence can be virtually ignored.

Alternatively, in the case when there are further more defective reference cells, a saving process by using a redundant word line may be carried out.

Moreover, another system may be proposed in which by using reference memory cells for storing data "0" and data "1", the intermediate value is used as a reference voltage. In this system, in order to cut off the reference memory cell forming the pair when either one of the reference memory cells for storing data "0" and data "1" becomes defective, the row address of the reference memory cell forming the corresponding pair is registered so that the connection control signals DL and DR may be generated.

As described above, in the semiconductor device 1 relating to the fifth embodiment, even when a defective reference memory cell is present, the defective reference memory cell is not substituted to be saved by using a redundant bitline, but excluded from the parallel arrangement of the reference memory cells. As a result, while obtaining an effect of improved sense margin by the parallel arrangement of the reference memory cells, it becomes possible to avoid the increase of the chip area and the complexity of the saving circuit.

Sixth Embodiment

Referring to FIGS., the following description will discuss a sixth embodiment.

In the semiconductor device 1 relating to the fifth embodiment, a current source (P-channel-type MOS transistor P02 in FIG. 23) on the reference memory cell side excluded from the parallel connection is kept connected to another reference memory cell. For example, in FIG. 22, even when the connection control signal DR0 is controlled to the L-level so that the reference memory cell included in the memory mat 51-1b is excluded from the parallel arrangement, a current supply to the other reference memory cells from the current source included in the sense amplifier 41-1 is carried out.

In the above-mentioned state, since the number of the reference memory cells to be parallel-arranged and the number of the current sources to supply a current to the reference memory cells are different from each other, with the result that the reference current to be generated in accordance with the number of the reference memory cells to be parallel-arranged is varied. When the reference current is varied, the sense margin might deteriorate. For this reason, to stabilize the reference current at the time of reading out user data from the normal cell irrespective of the number of reference cells to be parallel-arranged makes it possible to improve the sense margin.

Therefore, in the sixth embodiment, the semiconductor device 1 in which the number of the reference memory cells parallel-arranged and the number of current sources are made equal to each other is explained.

Figure 30:
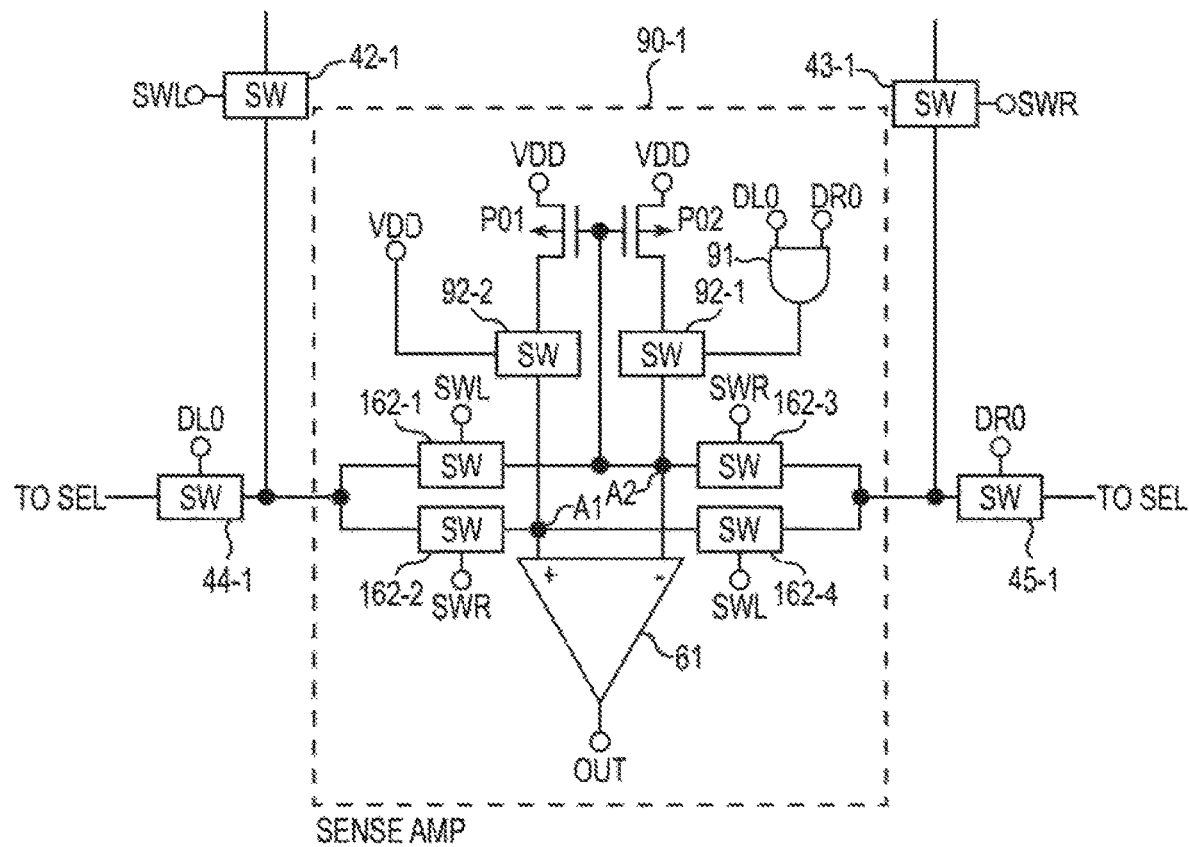
FIG. 30 is a view showing one example of a circuit configuration of a sense amplifier in accordance with a sixth embodiment.

FIG. 30 is a view showing one example of a circuit configuration of a sense amplifier 90 relating to the sixth embodiment. In FIG. 30, those constituent elements that are the same as those of FIG. 23 are indicated by the same reference numerals and the description thereof will be omitted.

The sense amplifier 90 differs from the sense amplifier 41 in that a NAND circuit 91 and two switches 92-1 and 92-2 are further provided therein.

The NAND circuit 91 uses the connection control signals DL and DR corresponding to the respective sense amplifiers 90 as its inputs. For example, since a sense amplifier 90-1 shown in FIG. 30 is a sense amplifier corresponding to switches 44-1 and 45-1, connection control signals DL0 and DR0 are inputted thereto. The output terminal of the NAND circuit 91 is connected to the control terminal of the switch 92-1.

The switch 92-1 is connected between the drain of the P-channel-type MOS transistor P02 and the inversion input terminal of the differential amplifier 61.

The switch 92-2 is connected between the drain of the P-channel-type MOS transistor P01 and the non-inversion input terminal of the differential amplifier 161. A voltage VDD is applied to the control terminal of the switch 92-2. Therefore, during the activation of the sense amplifier 90-1, the switch 92-2 is always kept conductive. Additionally, the switch 92-2 is inserted so as to allow the resistance value of the current path on the reference memory cell side with the switch 91-1 inserted therein to be matched with the resistance value of the current path on the normal cell side.

In FIG. 30, the following description will discuss a case in which a reference memory cell connected to the forward side of the switch 45-1 is excluded from the parallel arrangement by controlling the connection control signal DR0 to the L-level.

In this case, since the output signal of the NAND circuit 91 becomes the L-level, the corresponding current source on the reference cell side (P-channel-type MOS transistor P02 in FIG. 30) is cut off from the reference cells parallel-connected with one another.

On the other hand, since the switch 92-2 is kept conductive, a reference current generated by the reference memory cells parallel-connected with one another is duplicated by the current source on the normal cell side (P-channel-type P01 in FIG. 30). The duplicated reference current is allowed to flow through the normal cell connected to the forward side of the switch 44-1 so that a data readout operation is carried out by the differential amplifier 161.

As described above, in the semiconductor device 1 in accordance with the sixth embodiment, the number of the reference memory cells parallel-arranged and the number of the current sources are made equal to each other. As a result, the reference current is generated with substantially the same current value, irrespective of the number of the reference cells to be parallel-arranged. Therefore, the sense margin is further improved.

Seventh Embodiment

Referring to FIGS., the following description will discuss a seventh embodiment.

Figure 31:
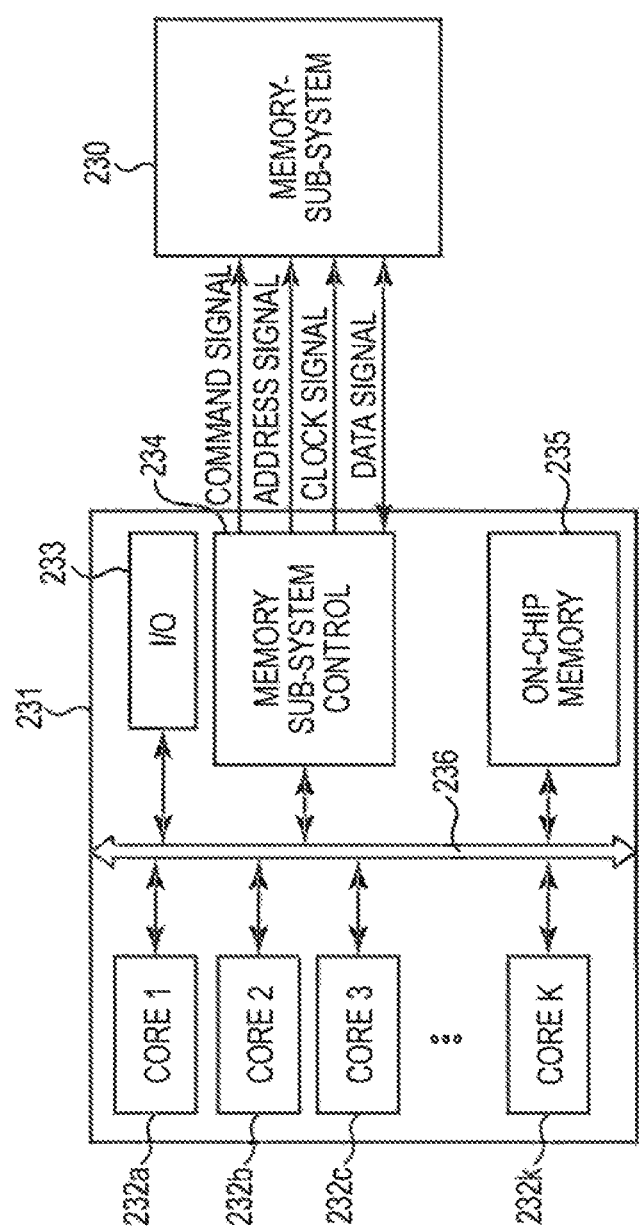
FIG. 31 is a block diagram showing a configuration of an information processing system in accordance with a seventh embodiment.

FIG. 31 is a block diagram showing a configuration of an information processing system in accordance with the seventh embodiment. In the seventh embodiment, an information processing system including a memory sub-system 230 including the semiconductor device 1 in accordance with the first to sixth embodiments and a multicore processor 231 is configured.

As shown in FIG. 31, the multicore processor 231 is constituted by k number of cores (core_1 to core_k; k represents a positive integer, the same is true for the following description) 232a to 232k, I/O 233, a memory sub-system control block 234 and an on-chip memory 235. The respective cores and the control block are mutually connected with one another, with an inner bus 236 interposed therebetween.

The memory sub-system control block 234 controls an accessing request from each of the k number of cores 232a to 232k, and sends a clock signal, a command signal and an address signal to the memory sub-system 230.

Moreover, the memory sub-system control block 234 sends writing data to the memory sub-system 230 or receives readout data in response to a transmitted command.

Although not particularly limited, the memory sub-system 230 may have a mode, such as a module or the like, in which 8 memory chips of 8 bits as a data bus width (for example the semiconductor device 1 in accordance with the first to sixth embodiment) are installed in parallel with one another in association with the data bus width of 64 bits, so as to be simultaneously operated. Alternatively, the 8 memory chips may be disposed on the module in parallel with one another, or may be disposed in a laminated mode. Moreover, a plurality of these modules or the like may be installed.

What is claimed is:

1. An apparatus, comprising:
   a plurality of second memory cells configured to provide a reference signal for reading user data stored in a first memory cell;
   a plurality of third memory cells configured to produce a second reference signal to read the data stored in the at least one of the plurality of second memory cells: and
   at least one switch provided between the plurality of second memory cells, wherein the plurality of second memory cells are coupled together to form a parallel circuit by the at least one switch to provide the reference signal.

2. The apparatus of claim 1, further comprising a first control circuit configured to read data stored in at least one of the plurality of second memory cells.

3. The apparatus of claim 1, wherein the plurality of third memory cells are coupled with one another to produce the second reference signal.

4. An apparatus, comprising:
   a plurality of second memory cells configured to provide a reference signal for reading user data stored in a first memory cell;
   at least one switch provided between the plurality of second memory cells, wherein the plurality of second memory cells are coupled together to form a parallel circuit by the at least one switch to provide the reference signal; and
   a first control circuit configured to read data stored in at least one of the plurality of second memory cells, wherein the first control circuit is configured to detect whether the data stored in the at least one of the plurality of second memory cells is an error.

5. The apparatus of claim 4, further comprising a memory element configured to store an address of the at least one of the plurality of second memory cells if the first control circuit detects the error.

6. The apparatus of claim 5, further comprising a second control circuit configured to decouple the at least one of the plurality of second memory cells from remaining ones of the plurality of second memory cells based, at least in part, on the address stored in the memory element.

7. The apparatus of claim 6, further comprising a plurality of third memory cells, wherein the second control circuit is further configured to couple at least one of the plurality of third memory cells to the remaining ones of the plurality of second memory cells.

8. A device comprising:
a plurality of normal cells configured to store user data; and
a plurality of reference memory cells configured to provide a reference signal for reading the user data stored in at least one of the plurality of normal cells, wherein the reference signal is based, at least in part, on reference data stored in the plurality of reference memory cells;
at least one switch provided between the plurality of reference memory cells, wherein the plurality of second memory cells are coupled together to form a parallel circuit by the at least one switch; and
a first control circuit configured to read the reference data stored in the plurality of reference memory cells to detect an error in the reference signal.

9. The device of claim 8, wherein the first control circuit is configured to change data stored in at least one of the plurality of reference memory cells if the error is detected in the reference signal.

10. The device of claim 9, wherein the first control circuit comprises an error correction code circuit configured to detect an error in the data stored in the at least one of the plurality of reference memory cells and change the data stored in the at least one of the plurality of reference memory cells if the error is detected.

11. The device of claim 10, wherein the error correction code circuit is located between the plurality of normal cells and the plurality of reference cells of a memory array.

12. The device of claim 10, wherein the error correction code circuit includes a syndrome generation circuit, a decision circuit, and a syndrome decoder.

13. The device of claim 8, wherein the at least one normal cell and the plurality of reference memory cells have a same device structure.

14. The device of claim 8, wherein the first control circuit is configured to read the reference data stored in the plurality of reference memory cells to detect an error in the reference signal responsive to a scrub command received from a memory controller.

15. The device of claim 8, further comprising a sense amplifier, wherein the sense amplifier is coupled to at least one of the plurality of reference memory cells by the at least one switch.

16. A method comprising:
receiving a scrub command;
coupling a plurality of reference cells in parallel to a common node by activating at least one switch;
reading reference data from at least one reference cell of the plurality of reference cells; and
determining if there is an error in the reference data read from the at least one reference cell.

17. The method of claim 16, wherein if the error is determined, further comprising correcting the reference data in the at least one reference cell.

18. The method of claim 16, wherein if the error is determined, further comprising decoupling the at least one reference cell from remaining ones of the plurality of reference cells.

19. The method of claim 16, further comprising:
generating a reference signal from the reference data of the at least one reference cell; and
reading user data from at least one normal cell, based, at least in part, on the reference signal.

* * * * *